(12) United States Patent
Hsieh et al.

(10) Patent No.: US 11,985,438 B2
(45) Date of Patent: May 14, 2024

(54) PIXEL ARRAY INCLUDING DARK PIXEL SENSORS

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 291 days.

(21) Appl. No.: 17/249,915

(22) Filed: Mar. 18, 2021

(65) Prior Publication Data
US 2022/0303481 A1 Sep. 22, 2022

(51) Int. Cl.
*H04N 25/633* (2023.01)
*H01L 27/146* (2006.01)
*H04N 17/00* (2006.01)
*H04N 25/63* (2023.01)

(52) U.S. Cl.
CPC ..... *H04N 25/633* (2023.01); *H01L 27/14623* (2013.01); *H01L 27/14685* (2013.01); *H04N 17/002* (2013.01); *H04N 25/63* (2023.01); *H01L 27/14627* (2013.01)

(58) Field of Classification Search
CPC .... H04N 25/633; H04N 17/002; H04N 25/63; H04N 25/76; H04N 25/671; H04N 25/672; H04N 25/703; H01L 27/14623; H01L 27/14685; H01L 27/14627; H01L 27/14603; H01L 27/1464; H01L 27/14645; H01L 27/14689
USPC ........................................................ 348/245
See application file for complete search history.

(56) References Cited

U.S. PATENT DOCUMENTS

| | | | | |
|---|---|---|---|---|
| 9,356,060 | B2 * | 5/2016 | Tai ..................... | H01L 27/14685 |
| 10,267,928 | B2 * | 4/2019 | Steadman Booker .... | G01T 1/24 |
| 2006/0237721 | A1 * | 10/2006 | Muramatsu .......... | H04N 25/745 |
| | | | | 348/E3.02 |
| 2007/0023614 | A1 * | 2/2007 | Park ..................... | H04N 3/1568 |
| | | | | 250/214.1 |
| 2009/0086069 | A1 * | 4/2009 | Gomi .................... | H04N 23/12 |
| | | | | 348/294 |
| 2009/0256923 | A1 * | 10/2009 | Chou .................... | H04N 23/80 |
| | | | | 348/222.1 |

(Continued)

Primary Examiner — Albert H Cutler
(74) Attorney, Agent, or Firm — Harrity & Harrity, LLP

(57) ABSTRACT

A pixel array includes a plurality of dark pixel sensors configured to generate dark current calibration information for a plurality of visible light pixel sensors included in the pixel array. The plurality of dark pixel sensors may generate respective dark current measurements for each of the plurality of visible light pixel sensors or for small subsets of the plurality of visible light pixel sensors. In this way, each of the plurality of visible light pixel sensors may be individually calibrated (or small subsets of the plurality of visible light pixel sensors may be individually calibrated) based on an estimated dark current experienced by each of the plurality of visible light pixel sensors. This may enable more accurate dark current calibration of the visible light pixel sensors included in the pixel array, and may be used to account for large differences in estimated dark currents for the visible light pixel sensors.

20 Claims, 28 Drawing Sheets

(56) References Cited

U.S. PATENT DOCUMENTS

| | | | |
|---|---|---|---|
| 2014/0014818 A1* | 1/2014 | Cho | H01L 27/14609 257/435 |
| 2014/0078349 A1* | 3/2014 | Velichko | H04N 25/60 348/241 |
| 2015/0076638 A1* | 3/2015 | Su | H01L 27/14636 257/432 |
| 2019/0154512 A1* | 5/2019 | Frank | G01J 5/20 |
| 2022/0014696 A1* | 1/2022 | Spiessens | H04N 25/63 |
| 2022/0068991 A1* | 3/2022 | Tanaka | H01L 27/14685 |

* cited by examiner

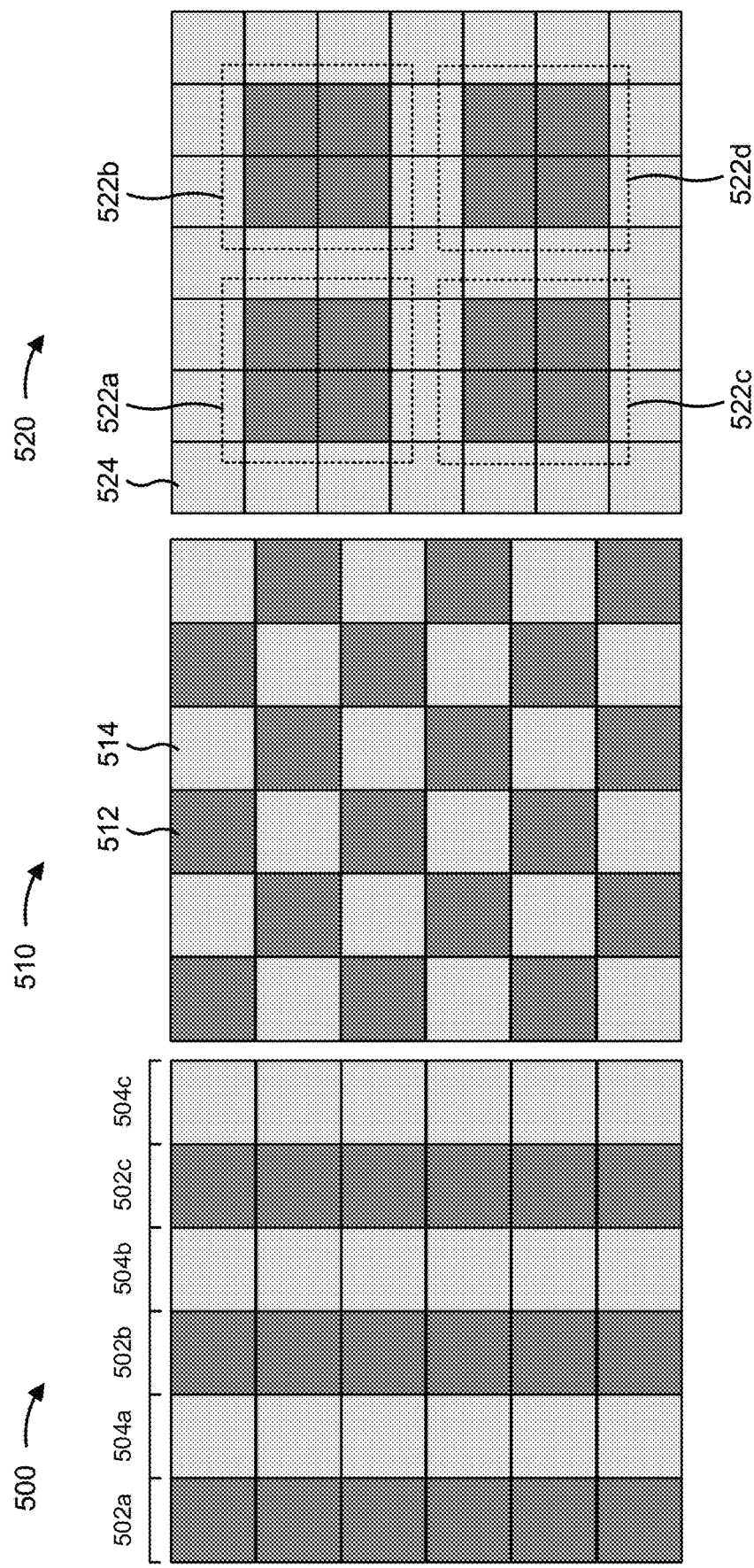

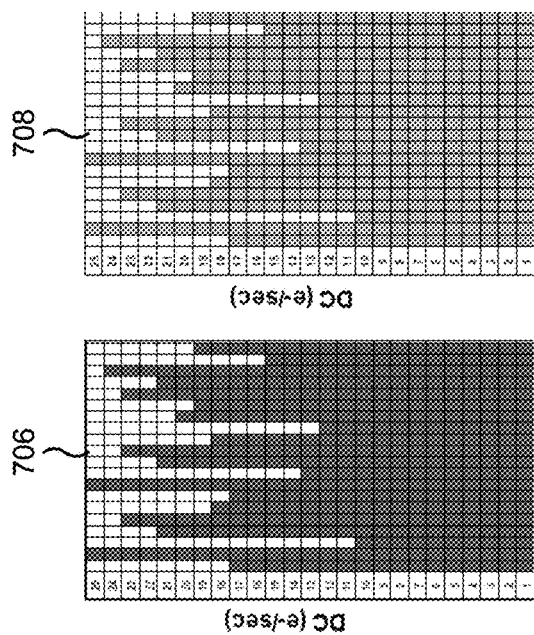
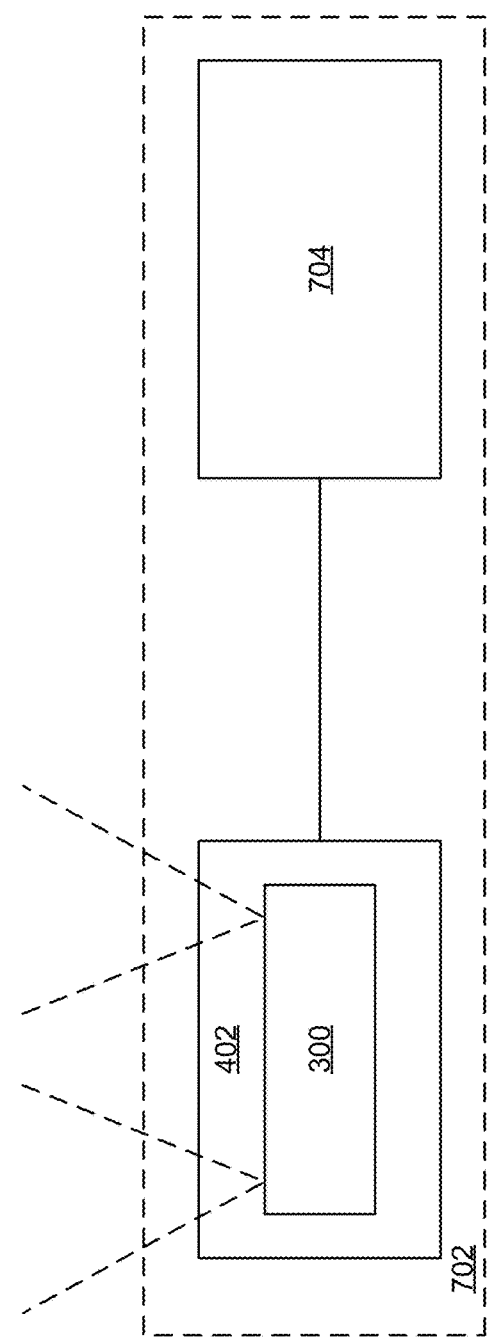
FIG. 7B

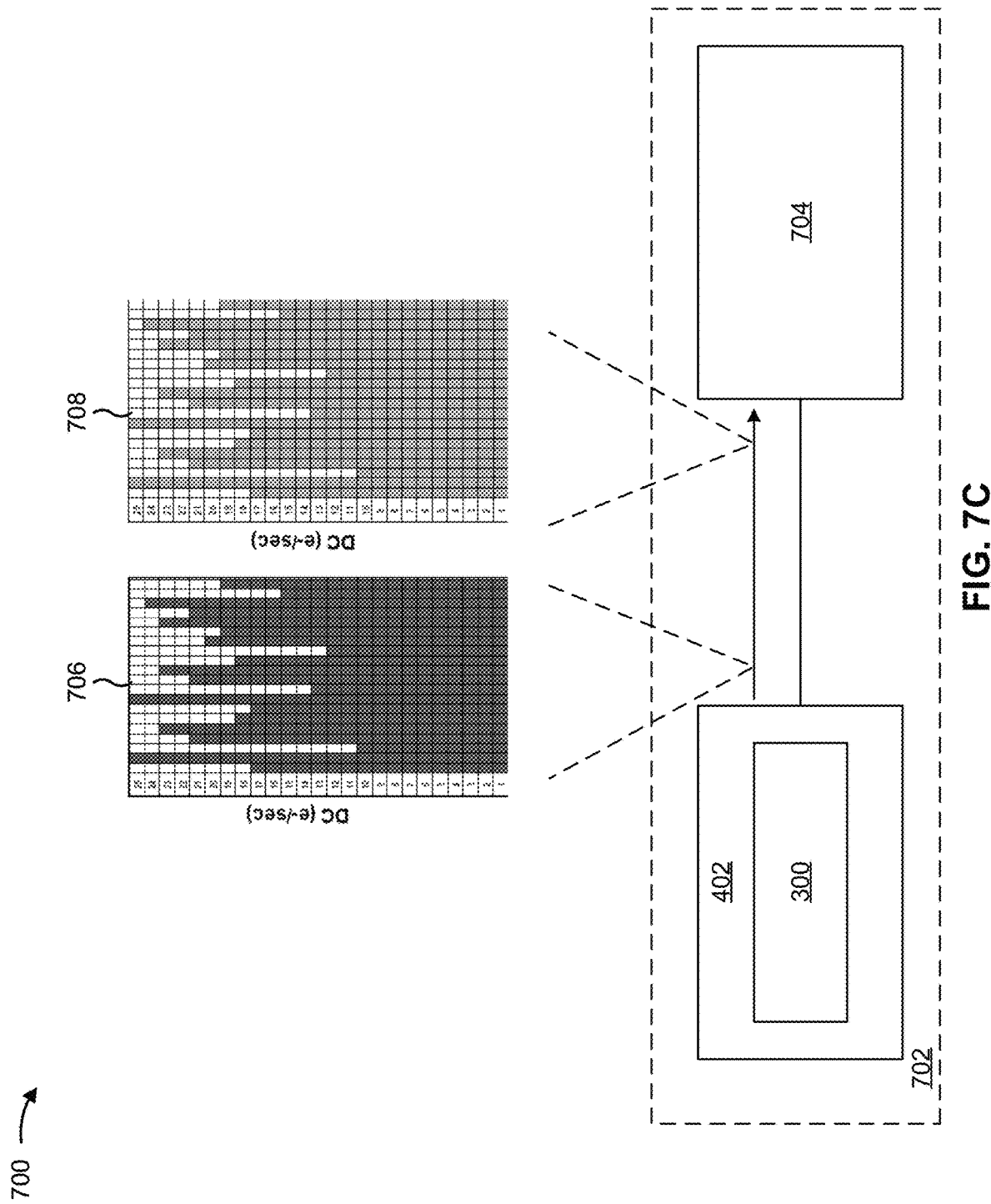

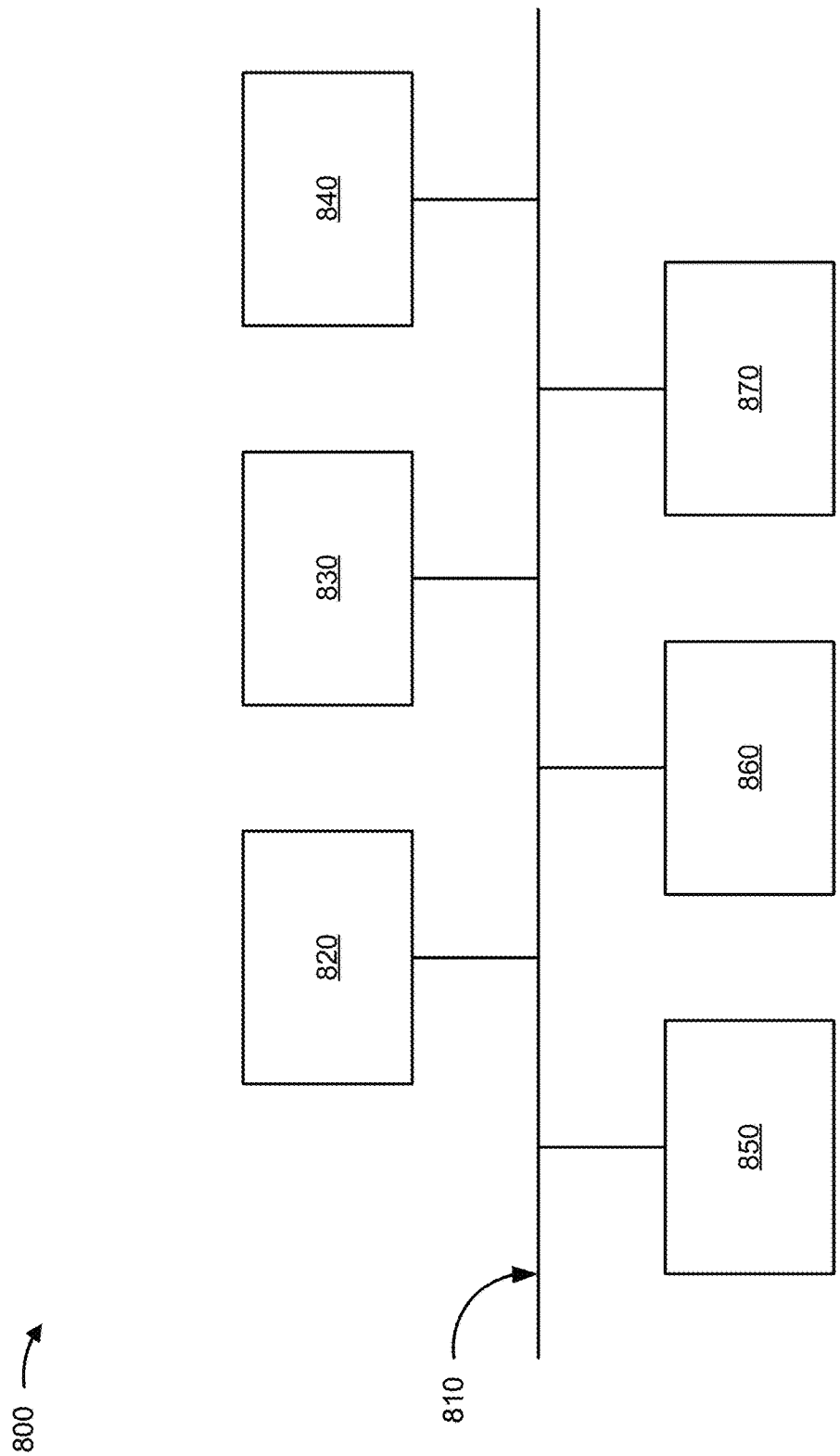

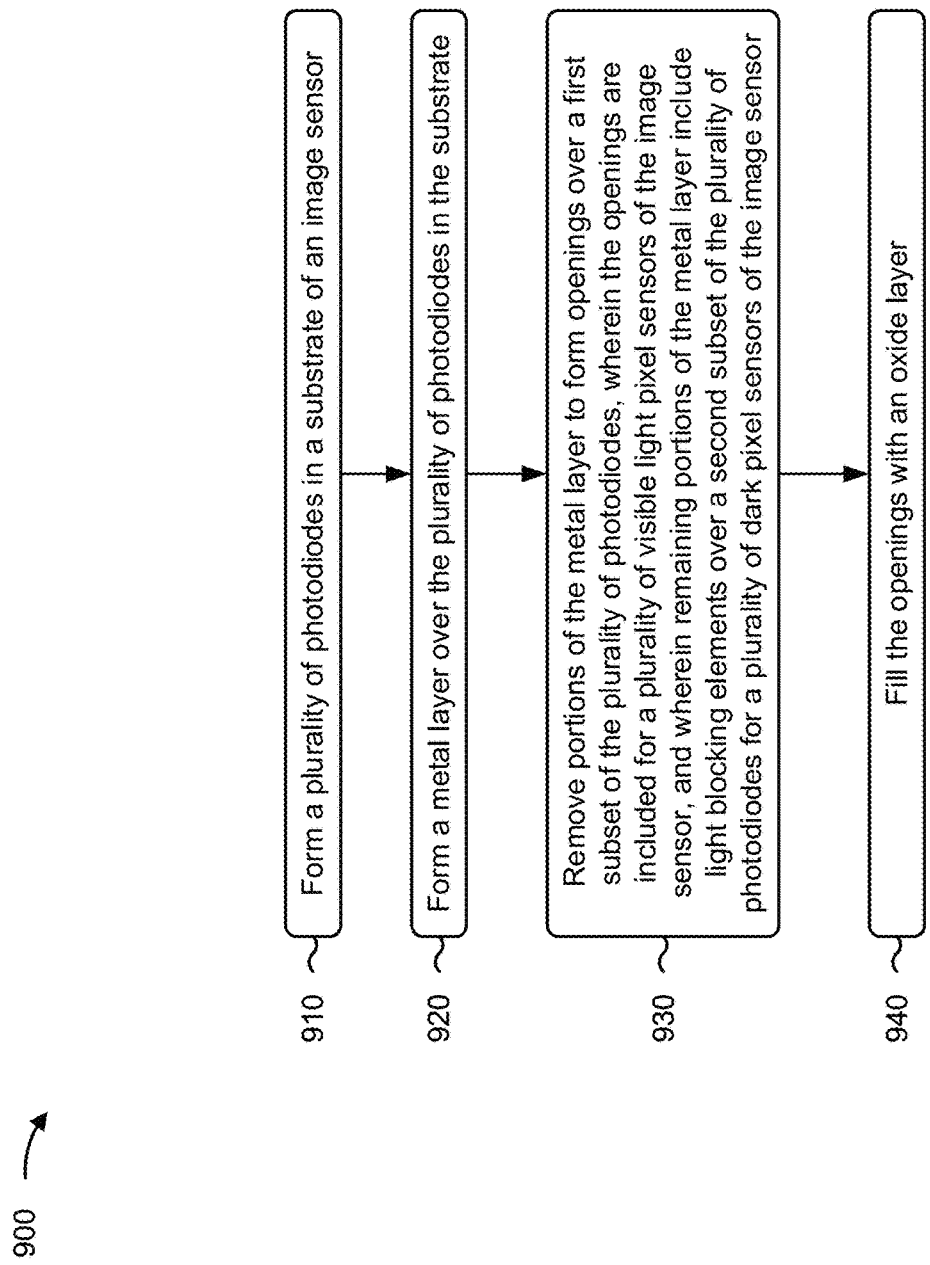

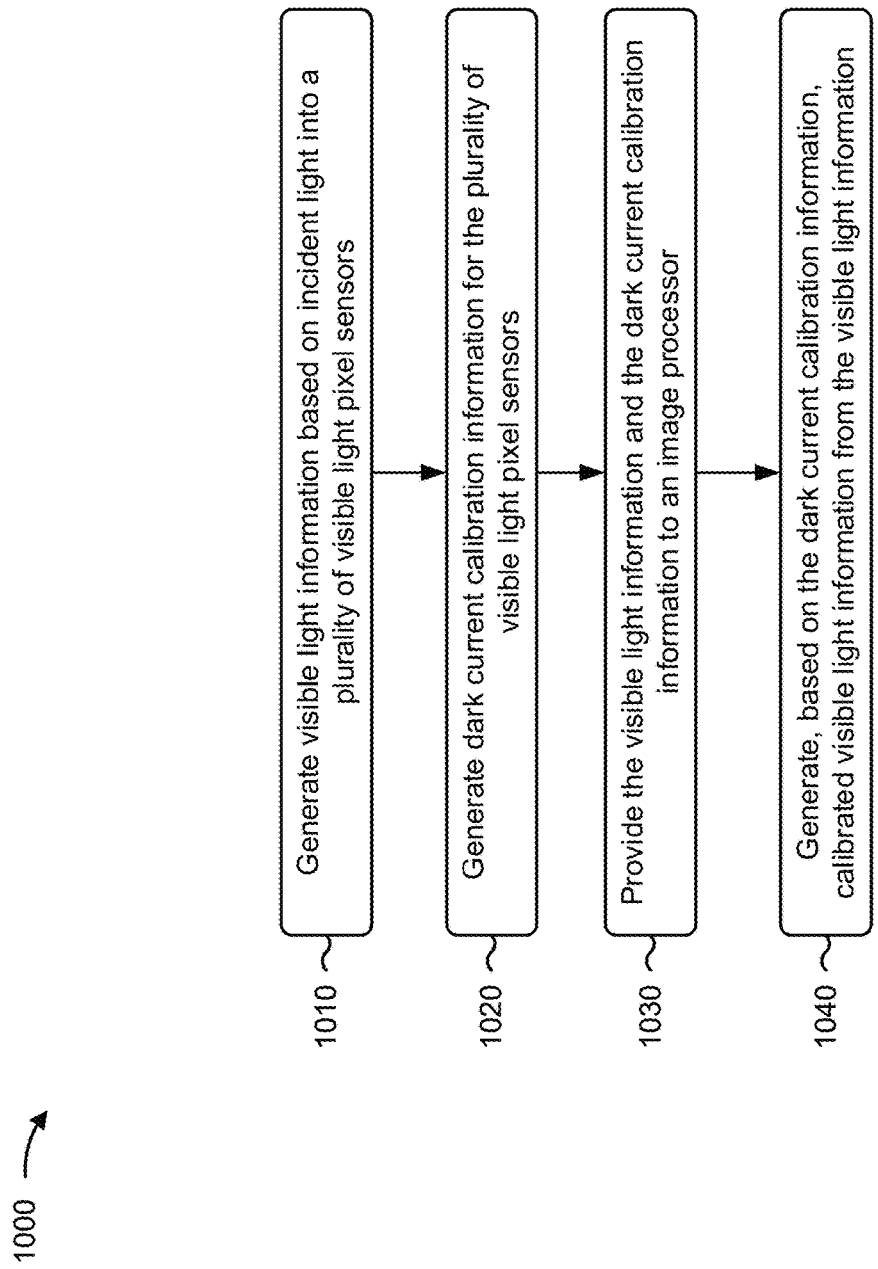

PIXEL ARRAY INCLUDING DARK PIXEL SENSORS

BACKGROUND

Complementary metal oxide semiconductor (CMOS) image sensors utilize light-sensitive CMOS circuitry to convert light energy into electrical energy. The light-sensitive CMOS circuitry may include a photodiode formed in a silicon substrate. As the photodiode is exposed to light, an electrical charge is induced in the photodiode (referred to as a photocurrent). The photodiode may be coupled to a switching transistor, which is used to sample the charge of the photodiode. Colors may be determined by placing filters over the light-sensitive CMOS circuitry.

Light received by pixel sensors of a CMOS image sensor is often based on the three primary colors: red, green, and blue (R, G, B). Pixel sensors that sense light for each color can be defined through the use of a color filter that allows the light wavelength for a particular color to pass into a photodiode. Some pixel sensors may include a near infrared (NIR) pass filter, which blocks visible light and passes NIR light through to the photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C and 6A-6C are diagrams of example pixel sensor configurations described herein.

FIGS. 7A-7D are diagrams of an example implementation described herein.

FIG. 8 is a diagram of example components of one or more devices of FIG. 1.

FIG. 9 is a flowchart of an example process relating to forming a pixel array.

FIG. 10 is a flowchart of an example process relating to generating calibrated visible light information.

DETAILED DESCRIPTION

Figure 1:
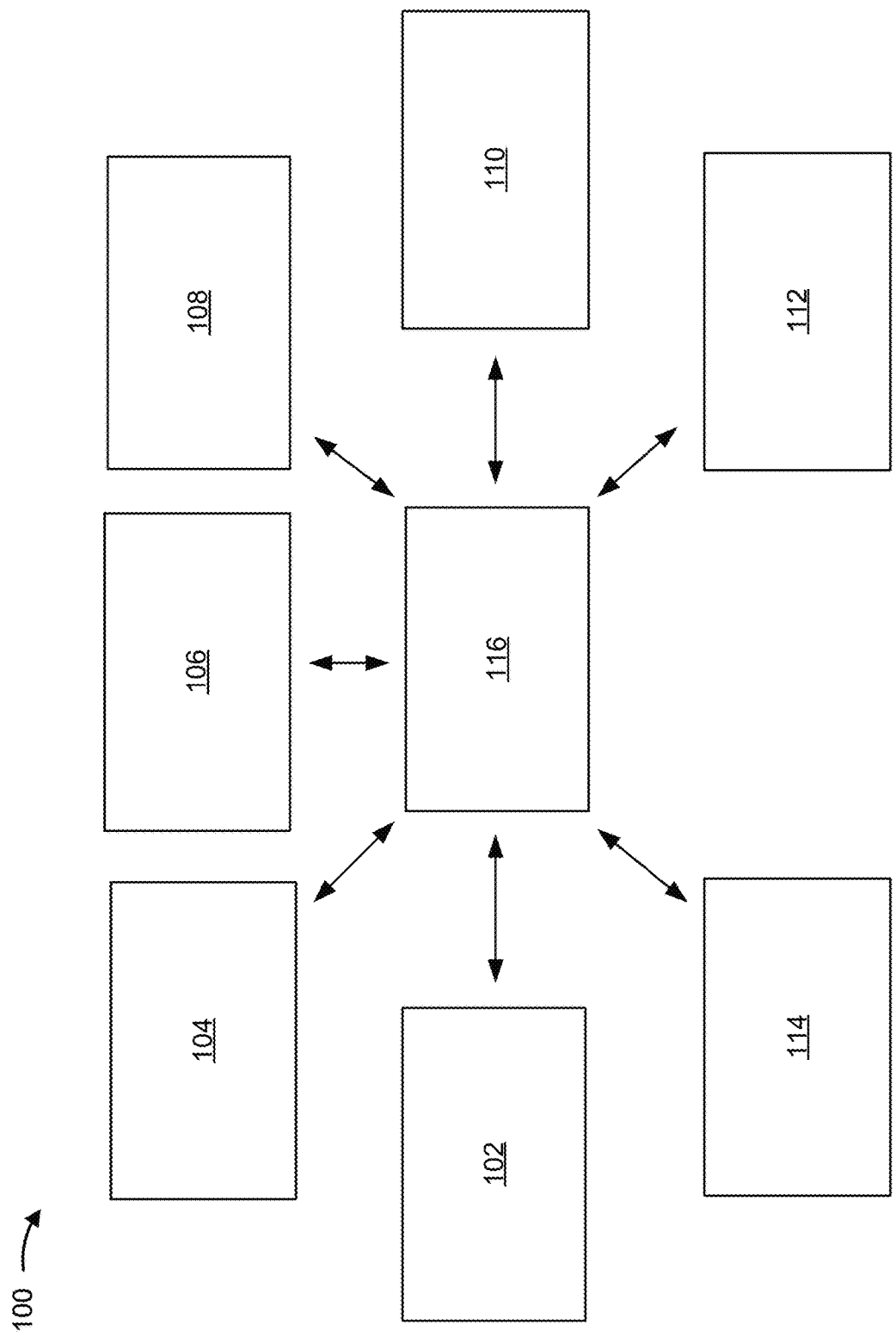
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dark current is an electrical current that occurs in a pixel sensor as a result of an energy source other than incident light. Dark current may result from, for example, heat generated by an image sensor in which the pixel sensor is included and/or one or more other devices near the image sensor. Dark current can cause noise and other defects in images and/or video captured by the image sensor. For example, dark current can artificially increase the photocurrent generated by the pixel sensors included in the image sensor, which can cause some of the pixels in an image or a video to register as a white pixel or a hot pixel.

Some implementations described herein provide a pixel array that includes a plurality of dark pixel sensors configured to generate dark current calibration information for a plurality of visible light pixel sensors included in the pixel array. In particular, the plurality of dark pixel sensors may generate respective dark current measurements for each of the plurality of visible light pixel sensors (e.g., one-to-one or per-pixel-sensor dark current measurements) or for small subsets of the plurality of visible light pixel sensors (e.g., subsets of two to four visible light pixel sensors). In this way, each of the plurality of visible light pixel sensors may be individually calibrated (or small subsets of the plurality of visible light pixel sensors may be individually calibrated) based on an estimated dark current experienced by each of the plurality of visible light pixel sensors. This individual dark current calibration may enable more accurate dark current calibration of the visible light pixel sensors included in the pixel array (e.g., relative to using an average dark current measurement generated by a large border of black level correction (BLC) surrounding the visible light pixel sensors for calibration across all of the visible light pixel sensors), and may be used to account for large differences in estimated dark currents for the visible light pixel sensors.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
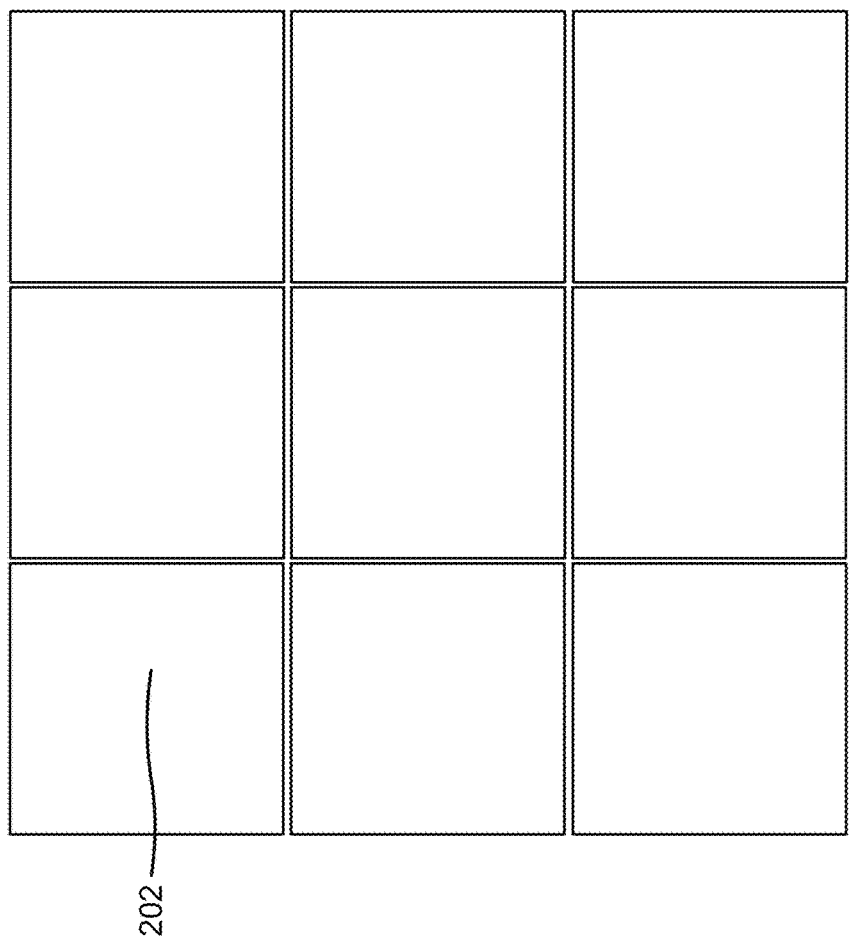
FIGS. 2 and 3A-3E are diagrams of an example pixel array described herein.

FIG. 2 shows a top-down view of the pixel array 200. In some implementations, the pixel array 200 may be included in an image sensor. The image sensor may include a complementary metal oxide semiconductor (CMOS) image sensor, a back side illuminated (BSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3A:
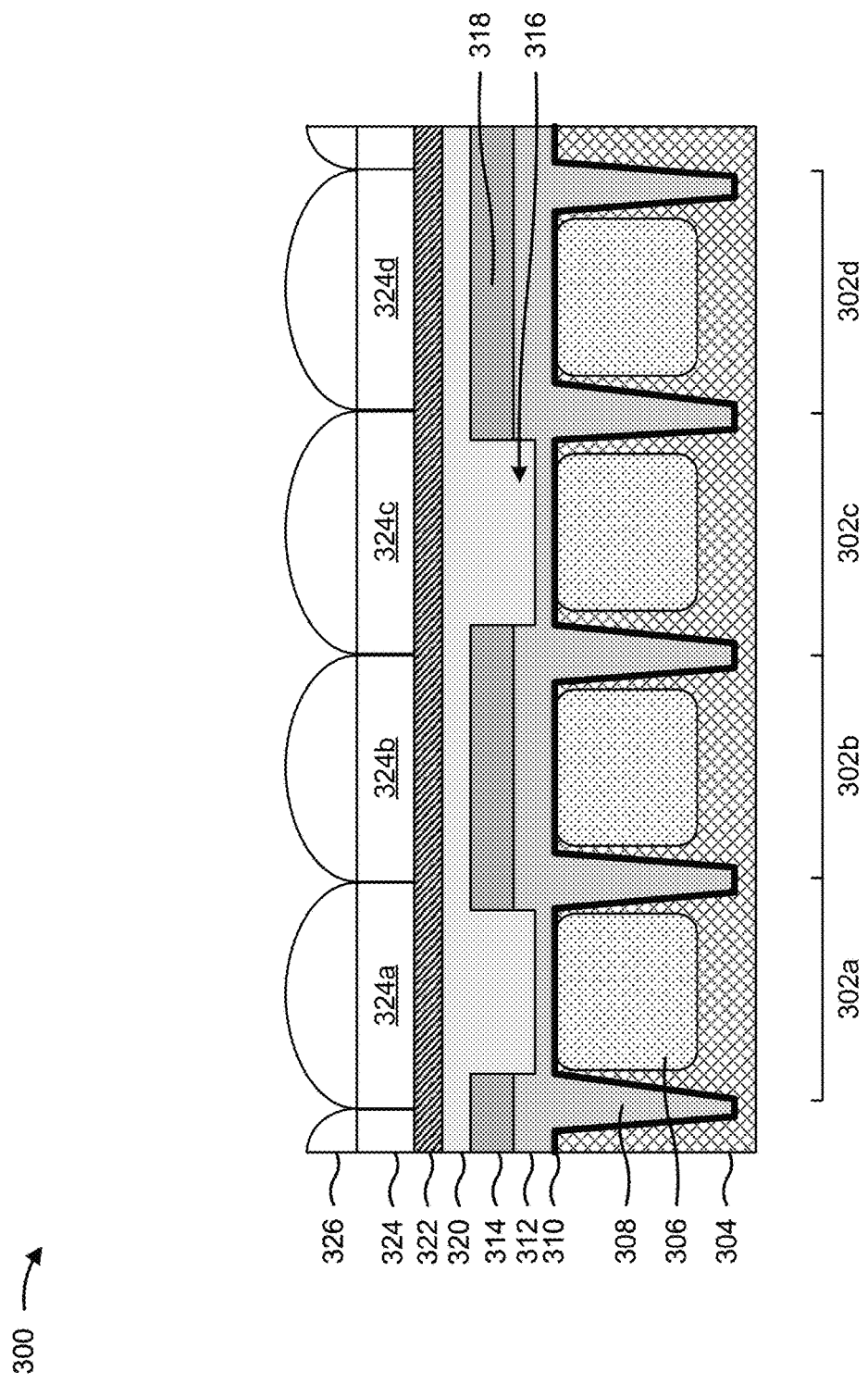

FIG. 3A is a diagram of an example pixel array 300 described herein. In some implementations, the example pixel array 300 illustrated in FIG. 3A may include, or may be included in, the pixel array 200 (or a portion thereof). In some implementations, the pixel array 300 may be included in an image sensor. The image sensor may include a CMOS image sensor, a BSI CMOS image sensor, or another type of image sensor.

As shown in FIG. 3A, the pixel array 300 may include a plurality of adjacent pixel sensors 302, such as pixel sensors 302a-302d. In some implementations, the pixel sensors 302a-302d are configured as square-shaped pixel sensors 202 included in the pixel array 200. In some implementations, the pixel sensors 302a-302d include other shape(s) of pixel sensors such as octagon-shaped pixel sensors or a combination of square-shaped and octagon-shaped pixel sensors.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

An isolation structure 308 may be included in the substrate 304 between adjacent pixel sensors 302. The isolation structure 308 may provide optical isolation by blocking or preventing diffusion or bleeding of light from one pixel sensor 302 to another pixel sensor 302, thereby reducing crosstalk between adjacent pixel sensors 302. The isolation structure 308 may include trenches or deep trench isolation (DTI) structures filled with an oxide layer 312. The isolation structure 308 may be formed in a grid layout in which the isolation structure 308 extends around the perimeters of the pixel sensors 302 in the pixel array 300 and intersects at various locations of the pixel array 300. In some implementations, the isolation structure 308 is formed in the backside of the substrate 304 to provide optical isolation between the pixel sensors 302, and thus may be referred to as a backside DTI (BDTI) structure.

The top surface of the substrate 304 and the surfaces of the isolation structure 308 (e.g., the sidewalls and the bottom surfaces) may be coated with an antireflective coating (ARC) 310. The ARC 310 may decrease reflection of incident light away from the photodiodes 306 and may increase transmission of incident light into the substrate 304 and the photodiodes 306. The ARC 310 may include a suitable material for reducing a reflection of incident light projected toward the photodiodes 306, such as a nitrogen-containing material or other examples.

An oxide layer 312 may be located above the substrate 304 and above and/or on the ARC 310. Moreover, the material of the oxide layer 312 may fill the isolation structure 308. The oxide layer 312 may function as a passivation layer between the substrate 304 and upper layers of the pixel array 300. In some implementations, the oxide layer 312 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 312 as a passivation layer.

A metal layer 314 may be located above and/or on the oxide layer 312 (or portions thereof). The metal layer 314 may provide crosstalk protection to reduce optical crosstalk between pixel sensors 302 of the pixel array 300. The metal layer 314 may reduce optical crosstalk by absorbing and/or reflecting incident light that might otherwise travel through a first pixel sensor 302 and into the photodiode 306 of a second pixel sensor 302, resulting in inaccurate photocurrent measurements in the second pixel sensor 302. The metal layer 314 may be formed of a metal material, such as gold, silver, aluminum, a metal alloy, or a similar type of metal.

The pixel sensors 302 of the pixel array 300 may include a plurality of visible light pixel sensors (e.g., pixel sensors 302a and 302c) and a plurality of dark pixel sensors (e.g., pixel sensors 302b and 302d). The visible light pixel sensors may be configured to collect and/or absorb photons of incident light in one or more visible light wavelengths (or wavelength ranges) corresponding to one or more colors of visible light. For example, the visible light pixel sensors may include a red light pixel sensor, a green light pixel sensor, a blue light pixel sensor, and/or a yellow light pixel sensor, among other examples. A visible light pixel sensor may be configured to generate visible light information based on photons of absorbed incident light. The visible light information may include, for example, a photocurrent that is based on the intensity of incident light absorbed in a particular visible light wavelength (or wavelength range). Color images and/or color video may be constructed from the intensities of various colors of incident light indicated in the visible light information for a plurality of visible light pixel sensors.

Openings 316 in the metal layer 314 may be included over the photodiodes 306 of the visible light pixel sensors to permit photons of incident light to travel through the metal layer 314 (e.g., through the openings 316 in the metal layer 314) and into the photodiodes 306 of the visible light pixel sensors. For example, an opening 316 may be included over the photodiode 306 of the pixel sensor 302a (which may include a visible light pixel sensor), an opening 316 may be included over the photodiode 306 of the pixel sensor 302c (which may include a visible light pixel sensor), and so on. The width of the openings 316 may be approximately as wide as, or wider than, the width of the photodiodes 306 so as to not impact the quantum efficiency of the visible light pixel sensors.

A dark pixel sensor may refer to a pixel sensor 302 that is included in a near dark environment such that the photodiode 306 of the pixel sensor 302 is not exposed to incident light (or so that the exposure to incident light is near zero). In this way, the dark pixel sensor may be configured to generate dark current calibration information that may be used to calibrate the visible light information generated by the visible light pixel sensors. The dark current calibration information may include a measurement of a dark current that is generated based on the amount of non-light energy absorbed in a photodiode 306 (energy that may otherwise introduce noise and other defects in images and/or video generated by the pixel array 300) of a dark pixel sensor. The measurement of the dark current may be used to calibrate a photocurrent generated by a visible light pixel sensor by subtracting or removing the magnitude of the measured dark current from the photocurrent.

In some implementations, the pixel array 300 includes a dark pixel sensor for each visible light pixel sensor included in the pixel array 300. In this way, each dark pixel sensor may generate respective dark current measurements for a single respective visible light pixel sensor (e.g., a one-to-one dark current measurement or a per-pixel-sensor dark current measurement), which may be used to individually calibrate each of the visible light pixel sensors in the pixel array 300. In some implementations, the pixel array 300 includes a dark pixel sensor for a small subset of visible light pixel sensors included in the pixel array. For example, the pixel array 300 may include dark pixel sensors for each subset of two (2) visible light pixel sensors, for each subset of ten (10) visible light pixel sensors, or for each subset of twenty (20) visible light pixel sensors, among other examples.

The quantity of dark pixel sensors (and thus, the quantity of visible light pixel sensors per dark pixel sensor) included in the pixel array 300 may be configured to satisfy a dark current performance parameter, a color saturation performance parameter, a color sensitivity performance parameter, and/or one or more other types of performance parameters. As an example, the dark current performance and the dark current calibration accuracy may be increased by including a greater quantity of dark pixel sensors in the pixel array 300, such as one dark pixel sensor per visible light pixel sensor or one dark pixel sensor per 2-10 visible light pixel sensors. The quantity of dark pixel sensors may be decreased to provide an increase in dark current performance and the dark current calibration accuracy relative to using an average dark current measurement generated by a BLC region while permitting a greater area of the pixel array 300 to be occupied by visible light pixel sensors, which may increase color saturation performance and color sensitivity performance.

The dark pixel sensors may include light blocking elements 318 over the photodiodes 306 of the dark pixel sensors to achieve the near dark environment for the photodiodes 306 of the dark pixel sensors. For example, a light blocking element 318 may be included over the photodiode 306 of the pixel sensor 302b, a light blocking element 318 may be included over the photodiode 306 of the pixel sensor 302d, and so on. The width of the light blocking elements 318 may be configured to absorb and/or reflect photons of incident light to block or prevent the photons from reaching the photodiodes 306 of the dark pixel sensors across a wide range of incident angles. For example, the width of the light blocking elements 318 may be configured such that the light blocking elements 318 fully extend between the openings 316 in the metal layer 314. In some implementations, a light blocking element 318 may be formed from the metal layer 314 and may include one or more metal layers. In some implementations, a light blocking element 318 may be formed of other types of materials, such as oxides, doped oxides, organic materials, and/or oxide derivatives, among other examples.

One or more passivation layers may be included over and/or on the metal layer 314, over and/or on the oxide layer 312 in the openings 316. For example, a BSI oxide layer 320 may be included on the metal layer 314 and on the oxide layer 312 in the openings 316. As another example, a buffer oxide layer 322 may be included on the BSI oxide layer 320 over the metal layer 314 and over the openings 316. In some implementations, the BSI oxide layer 320 and/or the buffer oxide layer 322 include an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the BSI oxide layer 320 and/or the buffer oxide layer 322 as a passivation layer.

A filter layer 324 including respective filter regions for each of the pixel sensors 302 may be included over and/or on the buffer oxide layer 322. For example, a filter region 324a may be included over the photodiode 306 of the pixel sensor 302a, a filter region 324b may be included over the photodiode 306 of the pixel sensor 302b, a filter region 324c may be included over the photodiode 306 of the pixel sensor 302c, a filter region 324d may be included over the photodiode 306 of the pixel sensor 302d, and so on.

In some implementations, a filter region included in a visible light pixel sensor may include a color filter configured to filter incident light to allow a particular wavelength of the incident light to pass to a photodiode 306 of the visible light pixel sensor. For example, a filter region may filter red light for a red pixel sensor, a filter region may filter green light for a green pixel sensor, a filter region may filter blue light for a blue pixel sensor, and so on. A blue filter region may permit the component of incident light near a 450 nanometer wavelength to pass and may block other wavelengths from passing. A green filter region may permit the component of incident light near a 550 nanometer wavelength to pass and may block other wavelengths from passing. A red filter region may permit the component of incident light near a 650 nanometer wavelength to pass and may block other wavelengths from passing. A yellow filter region may permit the component of incident light near a 580 nanometer wavelength to pass and may block other wavelengths from passing.

In some implementations, a filter region may be non-discriminating, which may define a white pixel sensor. A non-discriminating filter region may include a material that permits all wavelengths of light to pass into the associated photodiode 306 (e.g., for purposes of determining overall brightness to increase light sensitivity). In some implementations, a filter region may include a near infrared (NIR) bandpass filter region, which may define an NIR pixel sensor. An NIR bandpass filter region may include a material that permits the portion of incident light in an NIR wavelength range to pass to an associated photodiode 306 while blocking visible light from passing.

A filter region included over a photodiode 306 of a dark pixel sensor (e.g., the pixel sensor 302b and 302d) may include an opaque and/or light-blocking material to block or prevent light (e.g., ultraviolet light, visible light, infrared light, NIR light) from reaching the photodiode 306. The filter region may, in combination with the light blocking element 318 of the dark pixel sensor, reflect and/or absorb photons of incident light to block or prevent light from reaching the photodiode 306.

A micro-lens layer 326 may be included above and/or on the filter layer 324. The micro-lens layer 326 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, another micro-lens may be formed to focus incident light toward the photodiode 306 of the pixel sensor 302d, and so on.

Figure 3C:
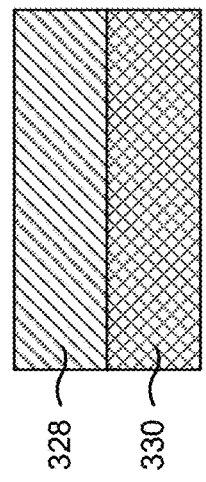
Figure 3E:
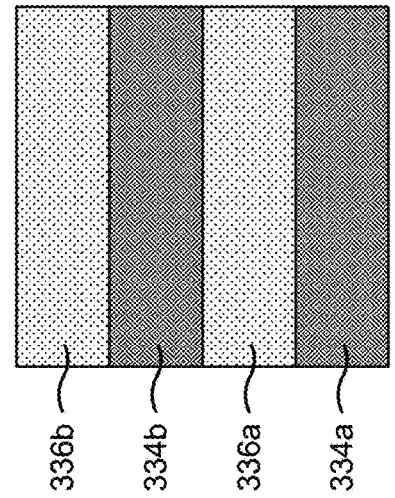
Figure 3B:
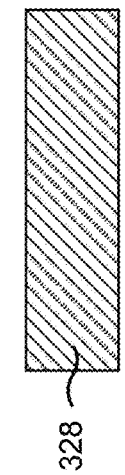

FIGS. 3B-3E illustrate various example configurations of light blocking elements 318. As shown in FIG. 3B, a light blocking element 318 may include a layer 328 of metal material, such as gold (Au), silver (Ag), copper (Cu), aluminum (Al), another type of highly reflective metal, an alloy thereof, or a combination thereof. The metal material may absorb and/or reflect incident light away from the photodiodes 306 of the dark pixel sensors so that the photodiodes 306 of the dark pixel sensors are in a dark environment, which increases the accuracy of the dark current measurements by the dark pixel sensors. In some implementations, gold may be used in implementations where the incident light into the pixel array 300 is estimated to include shorter wavelengths of light, such as in a range of approximately 200 nanometers to approximately 600 nanometers. In some implementations, aluminum may be used in implementations where the incident light into the pixel array 300 is estimated to include relatively longer wavelengths of light, such as in a range of approximately 650 nanometers to approximately 1250 nanometers.

As shown in FIG. 3C, a light blocking element 318 may include two layers of metal material, such as the layer 328 and layer 330. The layer 330 may include tungsten or another metal that, in combination with the metal material of the layer 328, further increases the light blocking performance of the light blocking element 318. In some implementations, the layer 328 is included over and/or on the layer 330. In some implementations, the layer 330 is included over and/or on the layer 328.

Figure 3D:
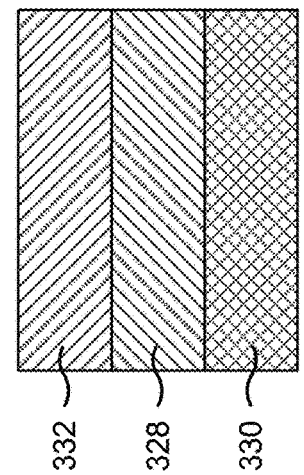

As shown in FIG. 3D, a light blocking element 318 may include three layers of metal material, such as the layer 328, the layer 330, and the layer 332. The layer 332 may include a metal material such as gold (Au), silver (Ag), copper (Cu), aluminum (Al), another type of highly reflective metal, an alloy thereof, or a combination thereof. In some implementations, the layer 328 and the layer 332 may include the same metal material. In some implementations, the layer 328 and the layer 332 may include different metal materials. The layer 328 and the layer 332 may include different metal materials to increase the light blocking performance of the light blocking element 318 across a wider range of light wavelengths. As an example, the layer 328 may include gold to block shorter wavelengths of light, and the layer 332 may include aluminum to block longer wavelengths of light. In some implementations, the layer 328 is included over and/or on the layer 332, and the layer 332 is included over and/or on the layer 330. In some implementations, the layer 330 is included in between the layer 328 and the layer 332. In some implementations, a light blocking element 318 may include four or more layers of metal material to further increase the light blocking performance of the light blocking element 318, which increases the height/thickness of the light blocking element 318.

As shown in FIG. 3E, a light blocking element 318 may include a plurality of layers of oxide compounds, nitride compounds, compound derivatives, doped compounds, and/or organic materials arranged in an alternating configuration. The alternating configuration may include alternating layers of a high refractive index material and a low refractive index material. For example, the light blocking element 318 may include a first layer 334a of a high refractive index material, a first layer 336a of a low refractive index material over and/or on the first layer 334a, a second layer 334b of a high refractive index material over and/or on the first layer 336a, and a second layer 336b of a low refractive index material over and/or on the second layer 334b.

Alternating layers of high refractive index material and low refractive index material may increase the likelihood that incident light will be reflected due to the difference in the refractive indexes of the high refractive index material and the low refractive index material. In some implementations, the difference in the refractive indexes of the high refractive index material and the low refractive index material may be in a range of approximately 2% difference to approximately 20% difference. Increasing the quantity of pairs of high refractive index material and low refractive index material may increase the light blocking performance of the light blocking element 318, but may also increase the overall height of the light blocking element 318. A greater quantity of pairs of high refractive index material and low refractive index material may be included in the light blocking element 318 in implementations where the difference in the refractive indexes of the high refractive index material and the low refractive index is relatively small (e.g., 2% difference) to account for the relatively small difference. Fewer pairs of high refractive index material and low refractive index material may be included in the light blocking element 318 in implementations where the difference in the refractive indexes of the high refractive index material and the low refractive index is relatively large (e.g., 20% difference), as fewer pairs may achieve a light blocking performance parameter for the light blocking element 318.

Example compounds that may be included in a light blocking element 318 include, but are not limited to, silicon oxide (SiO), silicon dioxide ($SiO_2$), magnesium oxide (MgO), aluminum oxide ($Al_2O_3$), ytterbium(III) oxide ($Yb_2O_3$), zinc oxide (ZnO), silicon nitride ($Si_3N_4$), tantalum (V) oxide ($Ta_2O_5$), zirconium dioxide ($ZrO_2$), hafnium dioxide ($HfO_2$), tellurium dioxide ($TeO_2$), and/or titanium dioxide ($TiO_2$). Example compound derivates may include, but are not limited to, derivates of the compounds described above that include calcium fluoride ($CaF_2$), boron (B), barium (Ba), phosphorous (P), lanthanum (La), and/or lead (Pb). Example doped compounds may include, but are not limited to, the compounds described above doped with silicon (Si), oxygen (O), and/or nitrogen (Ni).

The thickness of each of the layers 328-336 may be equal to or less than approximately 5000 angstroms to reduce and/or minimize stress and peeling of the layers 328-336.

Other values of the thickness of the layers 328-336 are within the scope of the present disclosure.

As indicated above, FIGS. 3A-3E are provided as examples. Other examples may differ from what is described with regard to FIGS. 3A-3E.

Figure 4A:
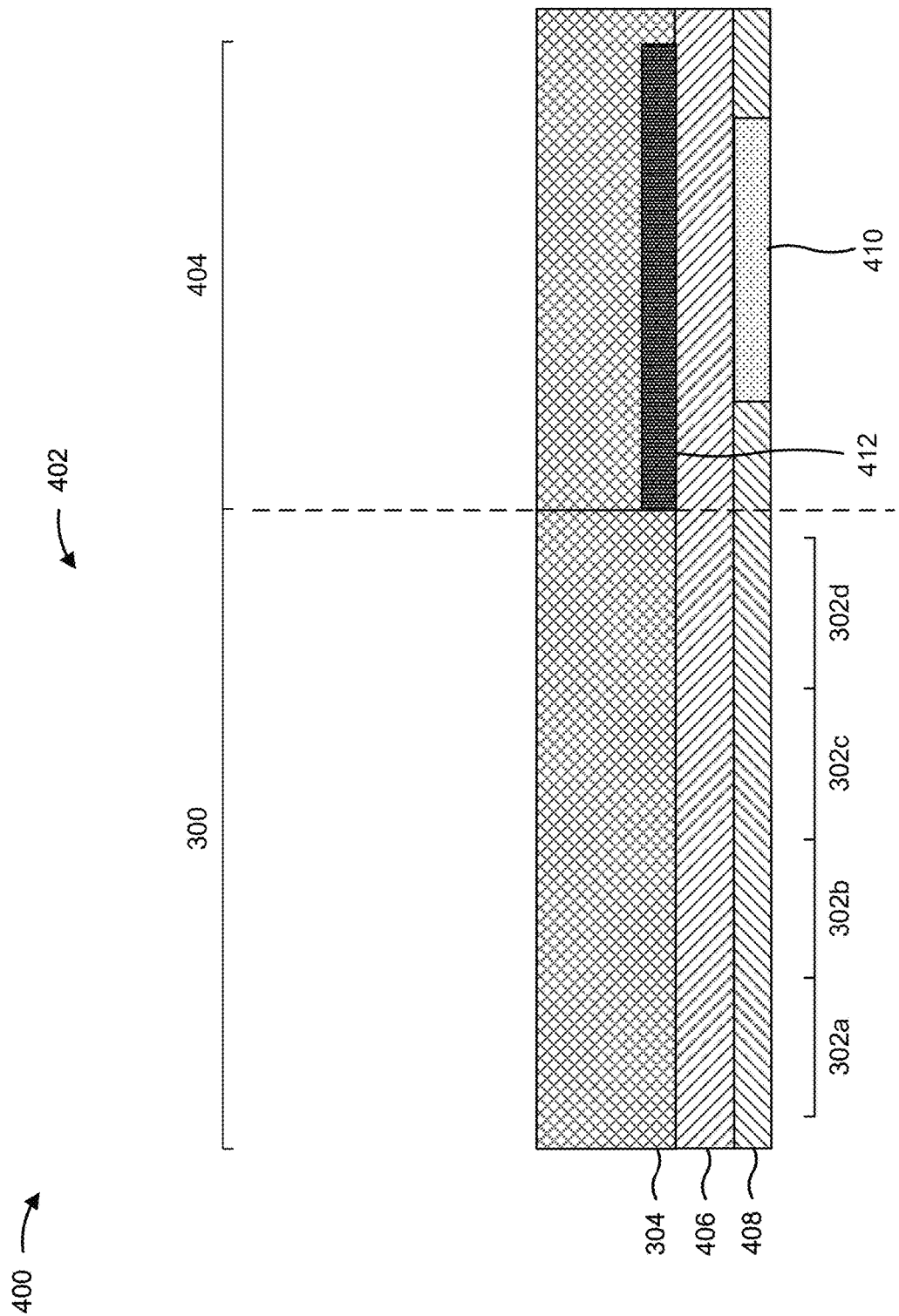
FIGS. 4A-4O are diagrams of an example implementation described herein.
Figure 4B:
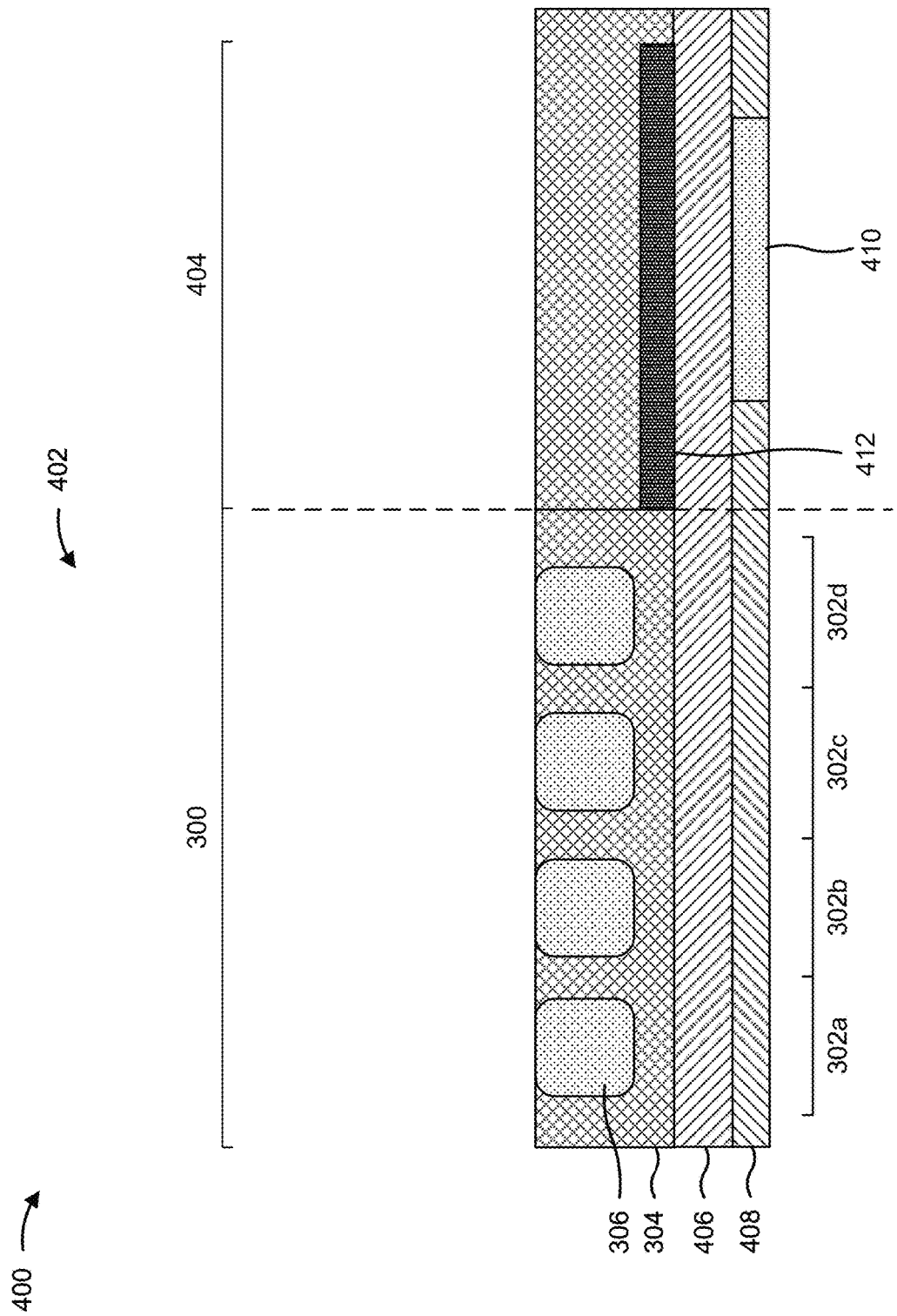
Figure 4C:
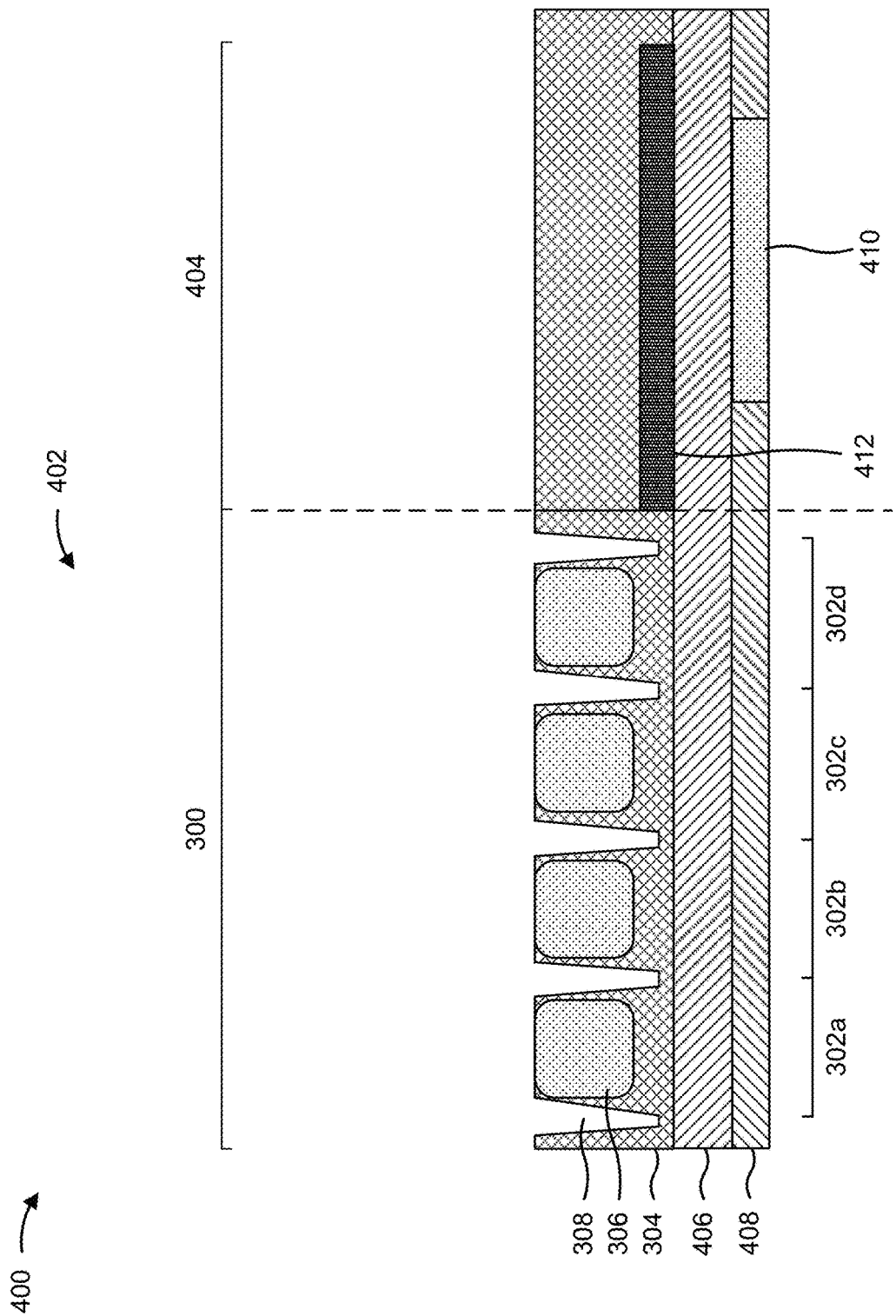
Figure 4D:
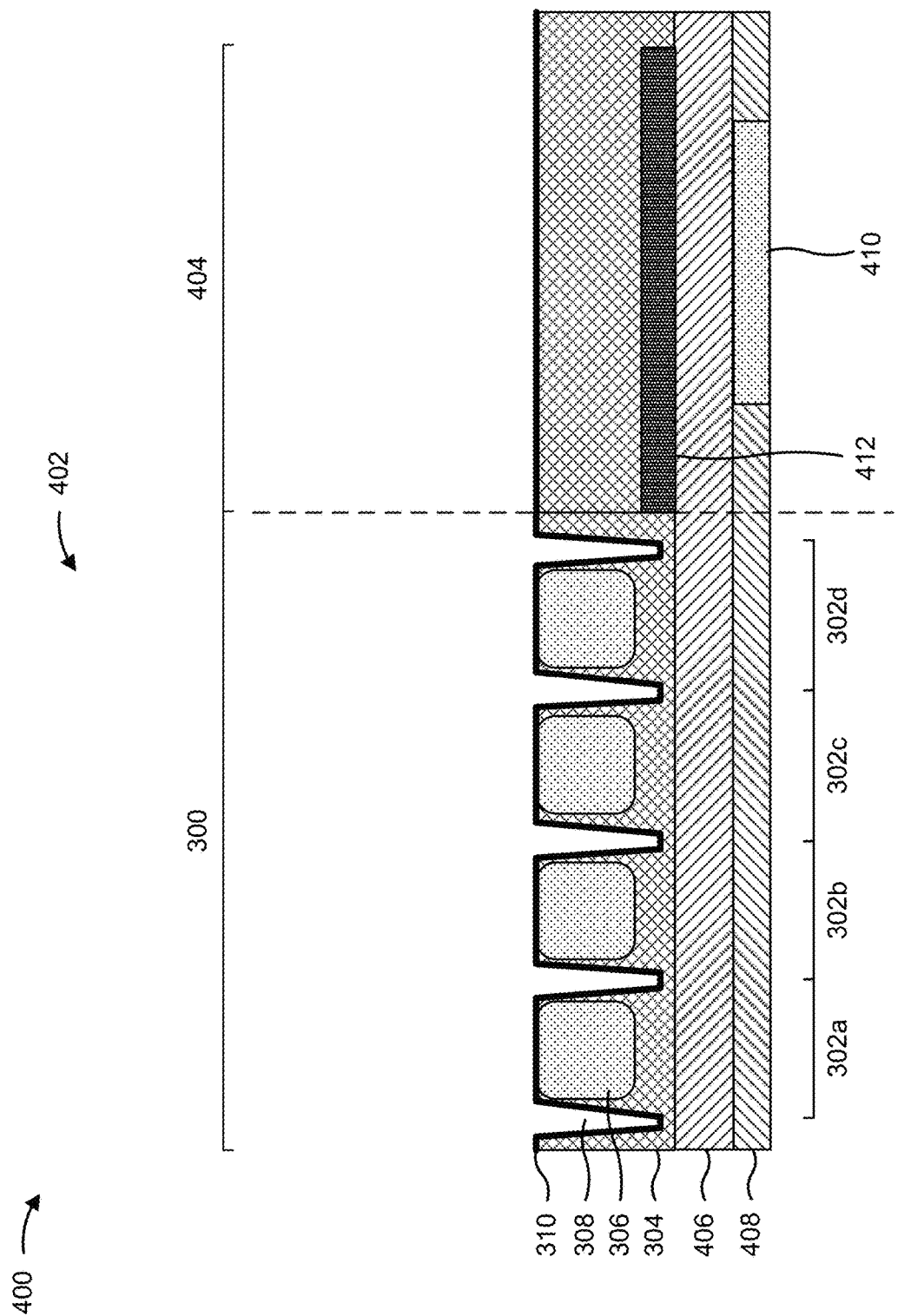
Figure 4E:
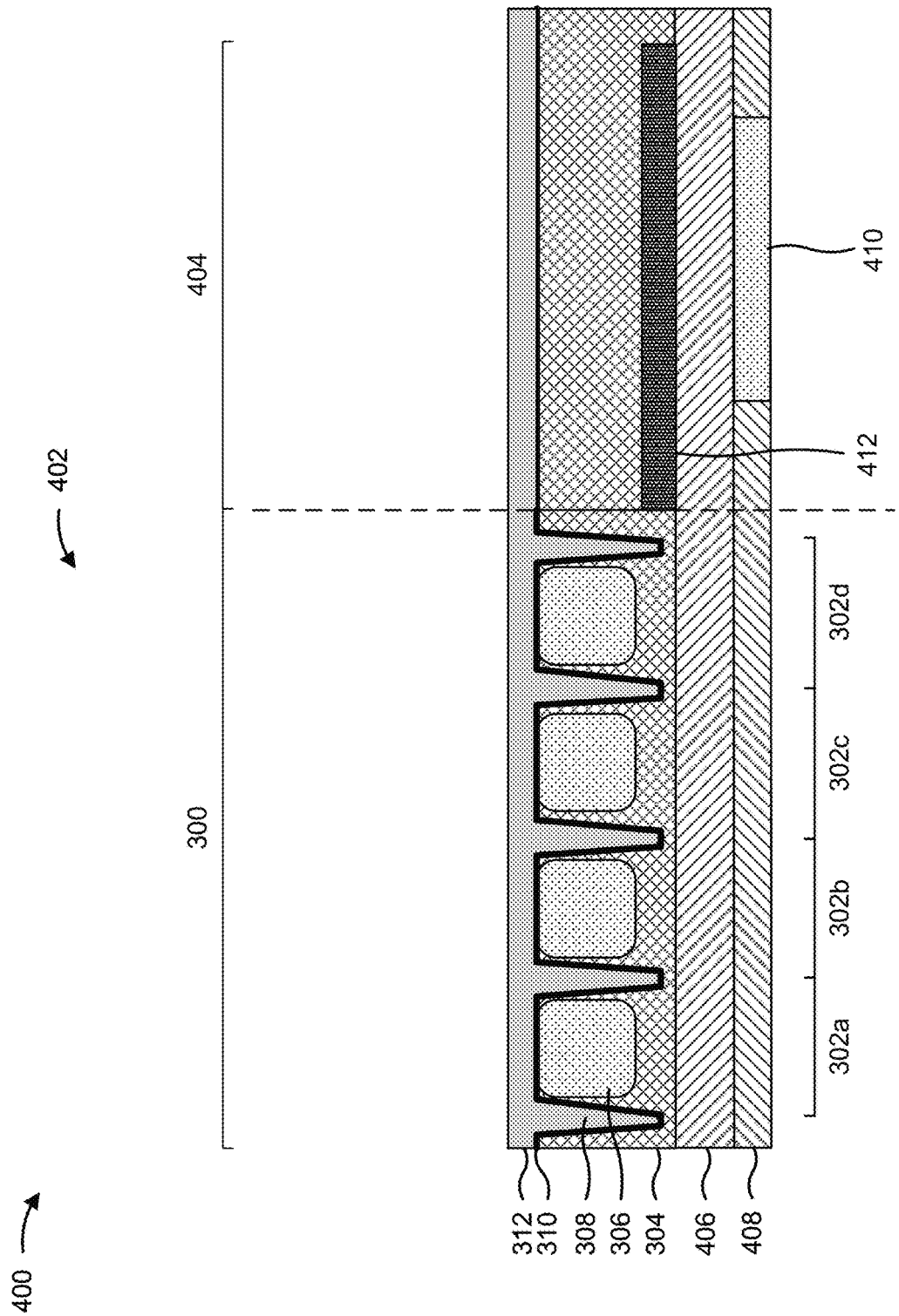
Figure 4F:
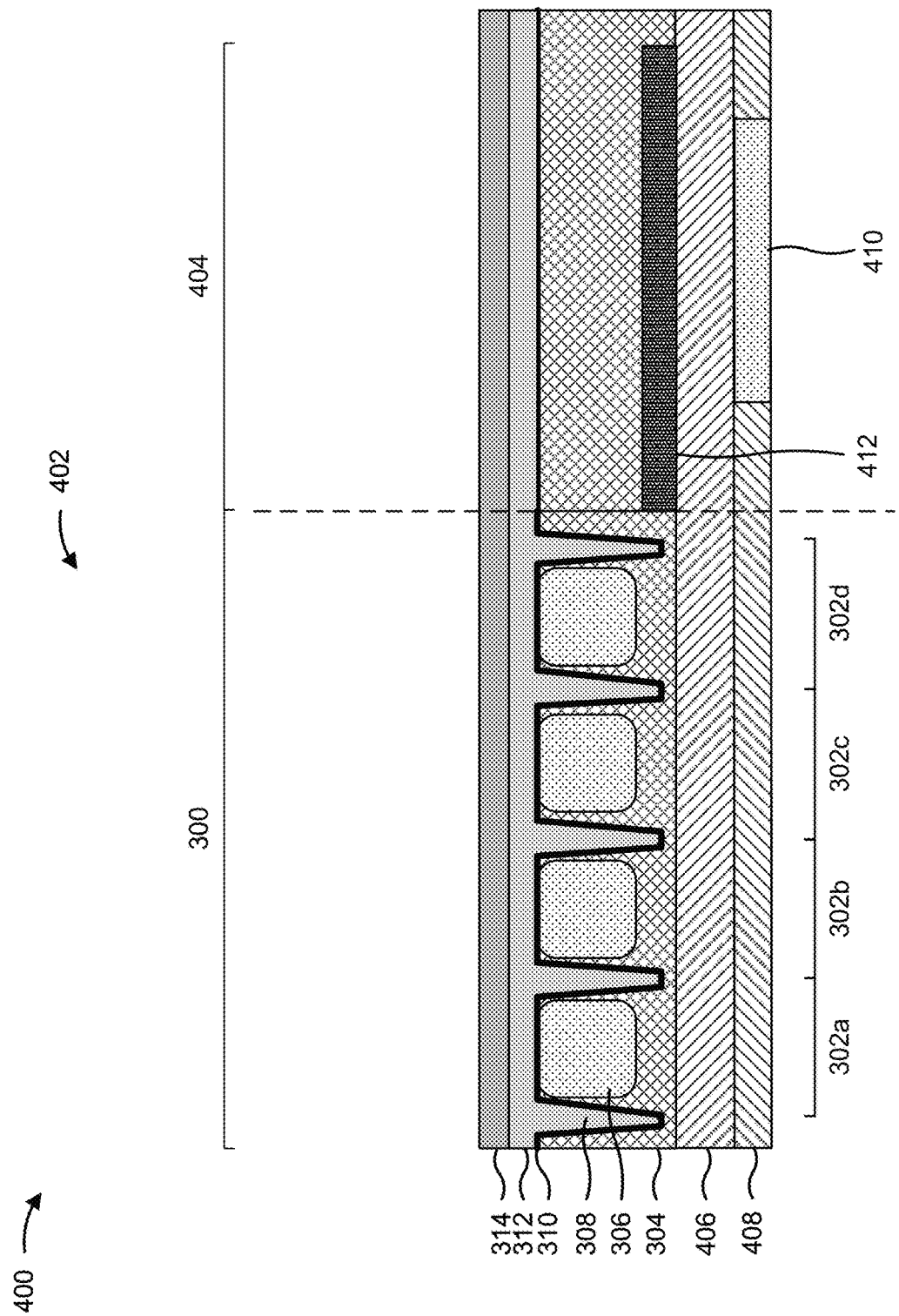
Figure 4G:
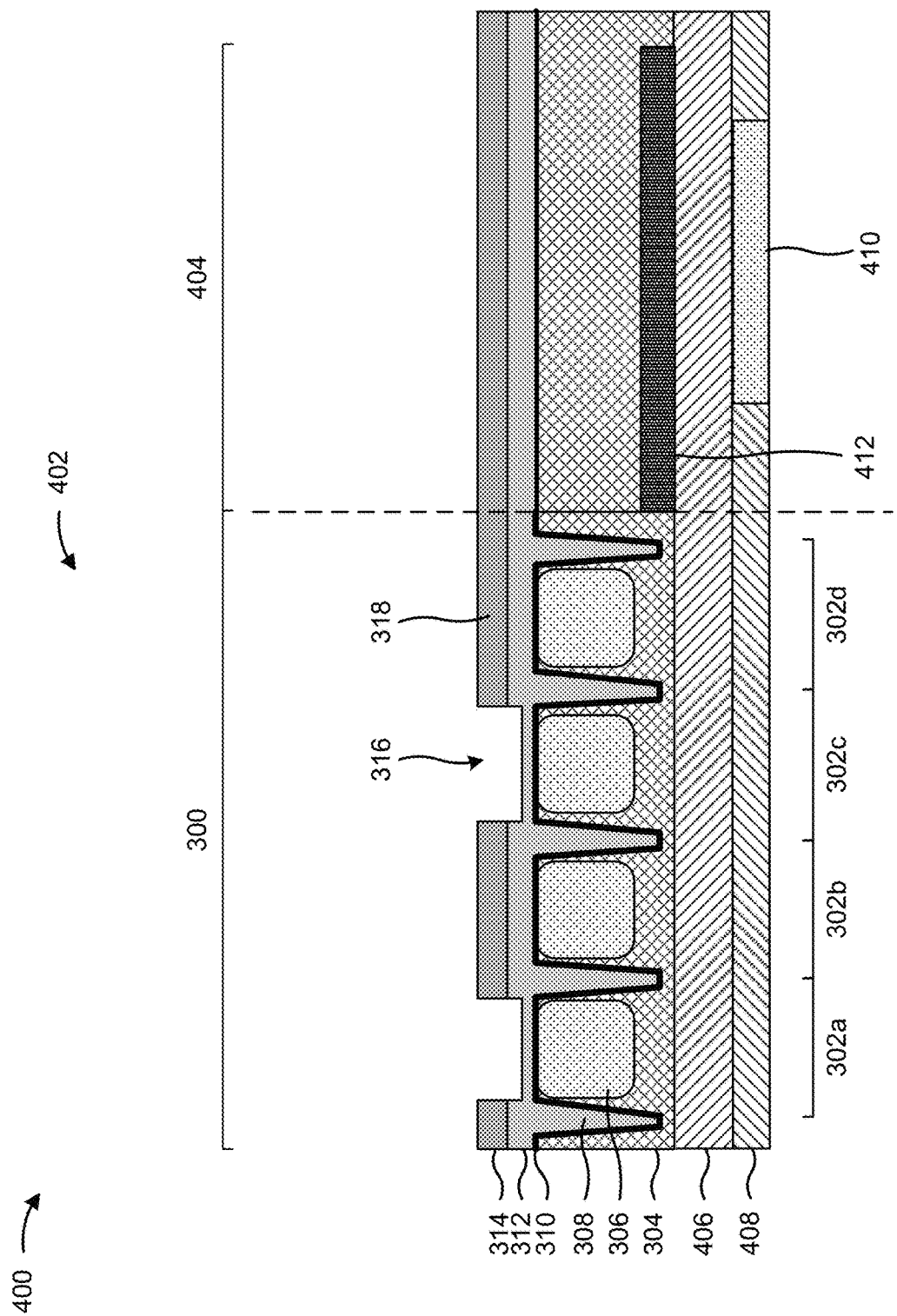
Figure 4H:
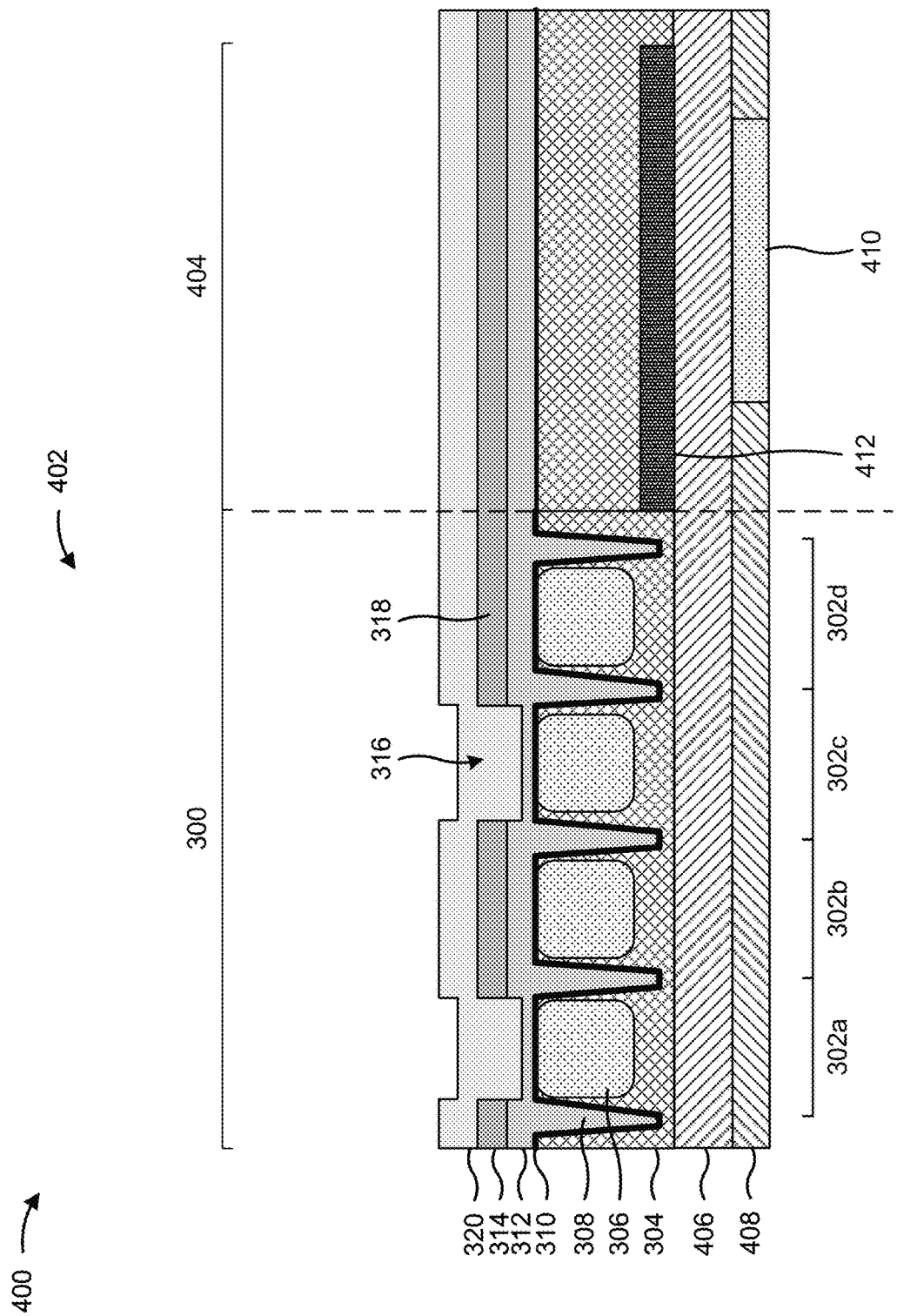
Figure 4I:
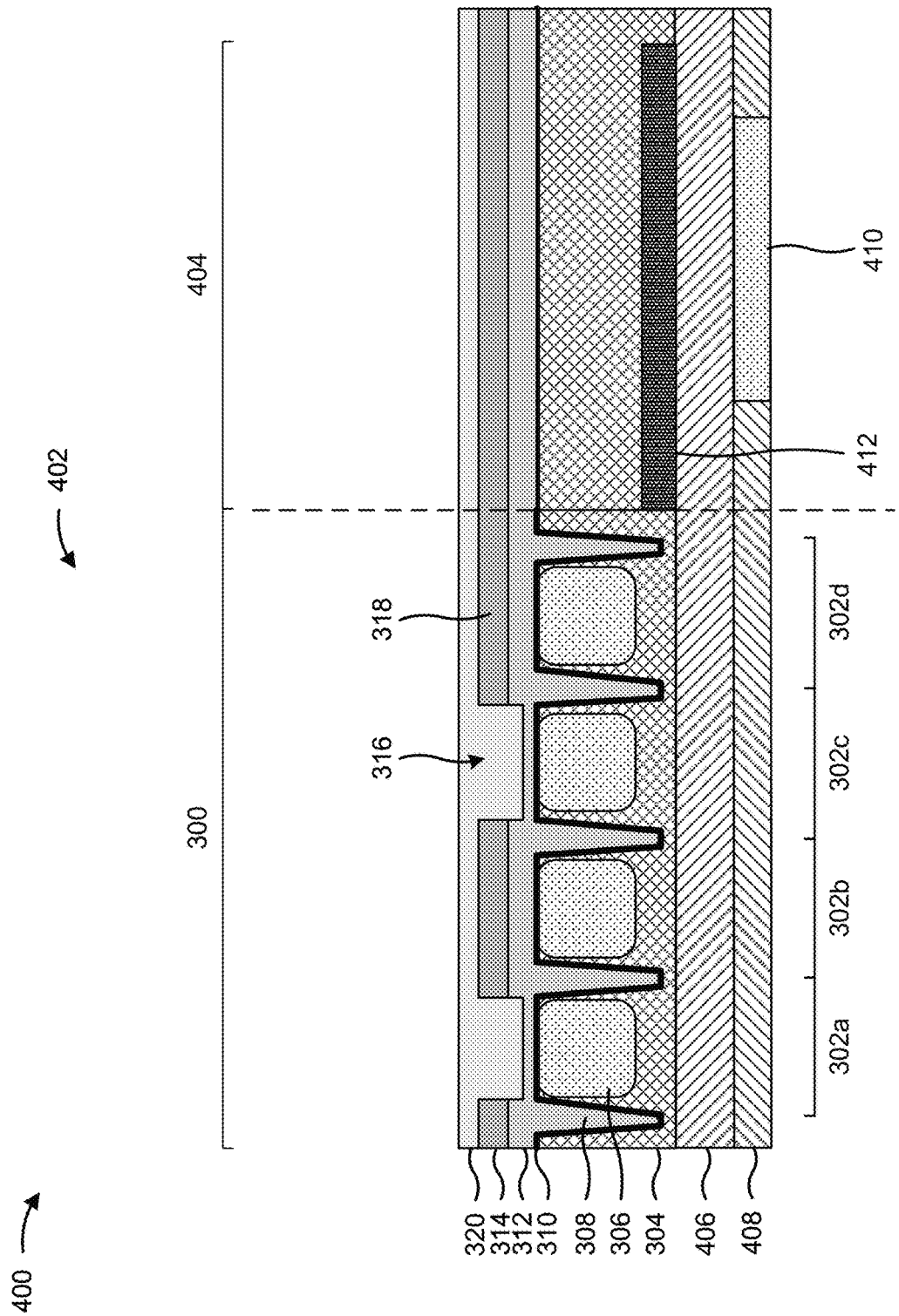
Figure 4J:
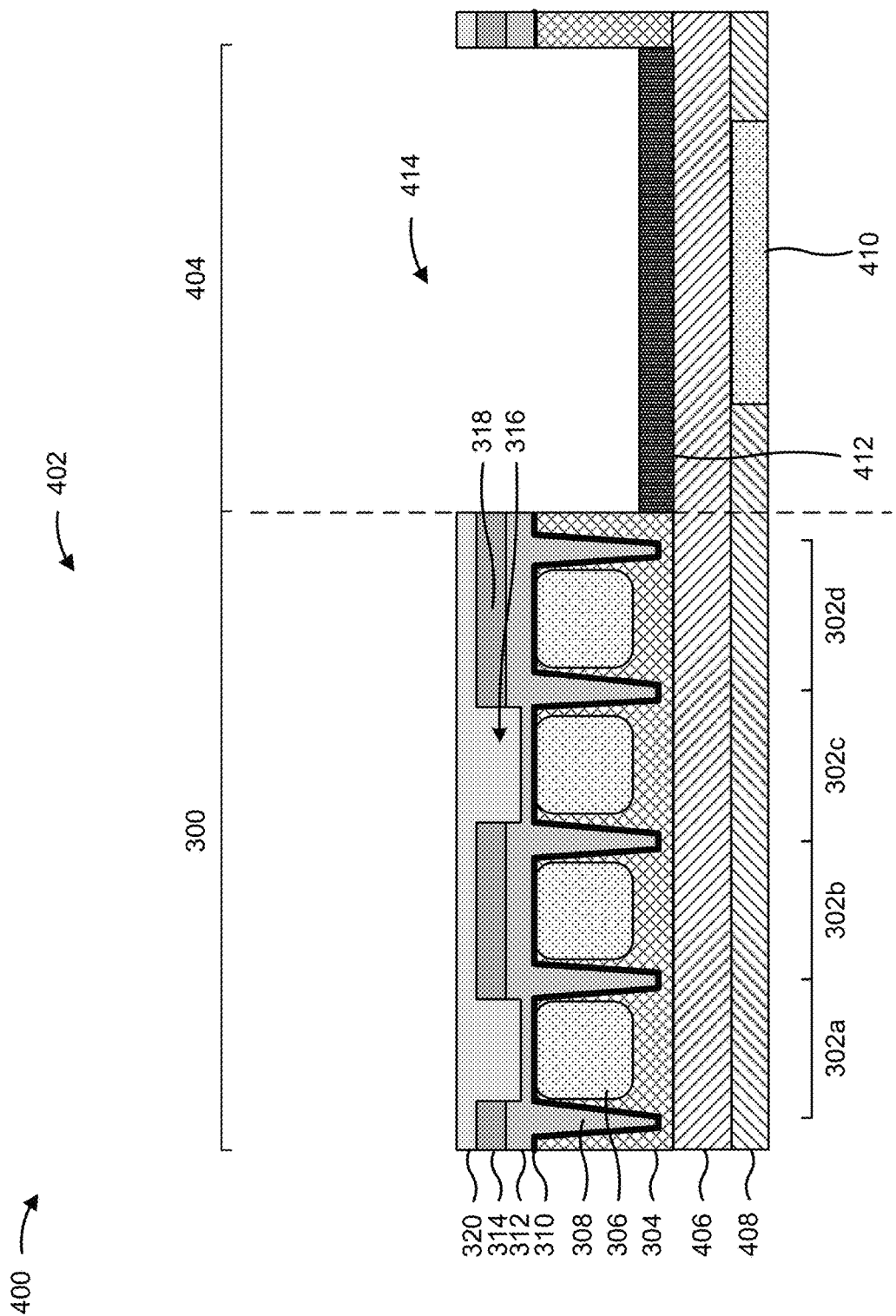
Figure 4K:
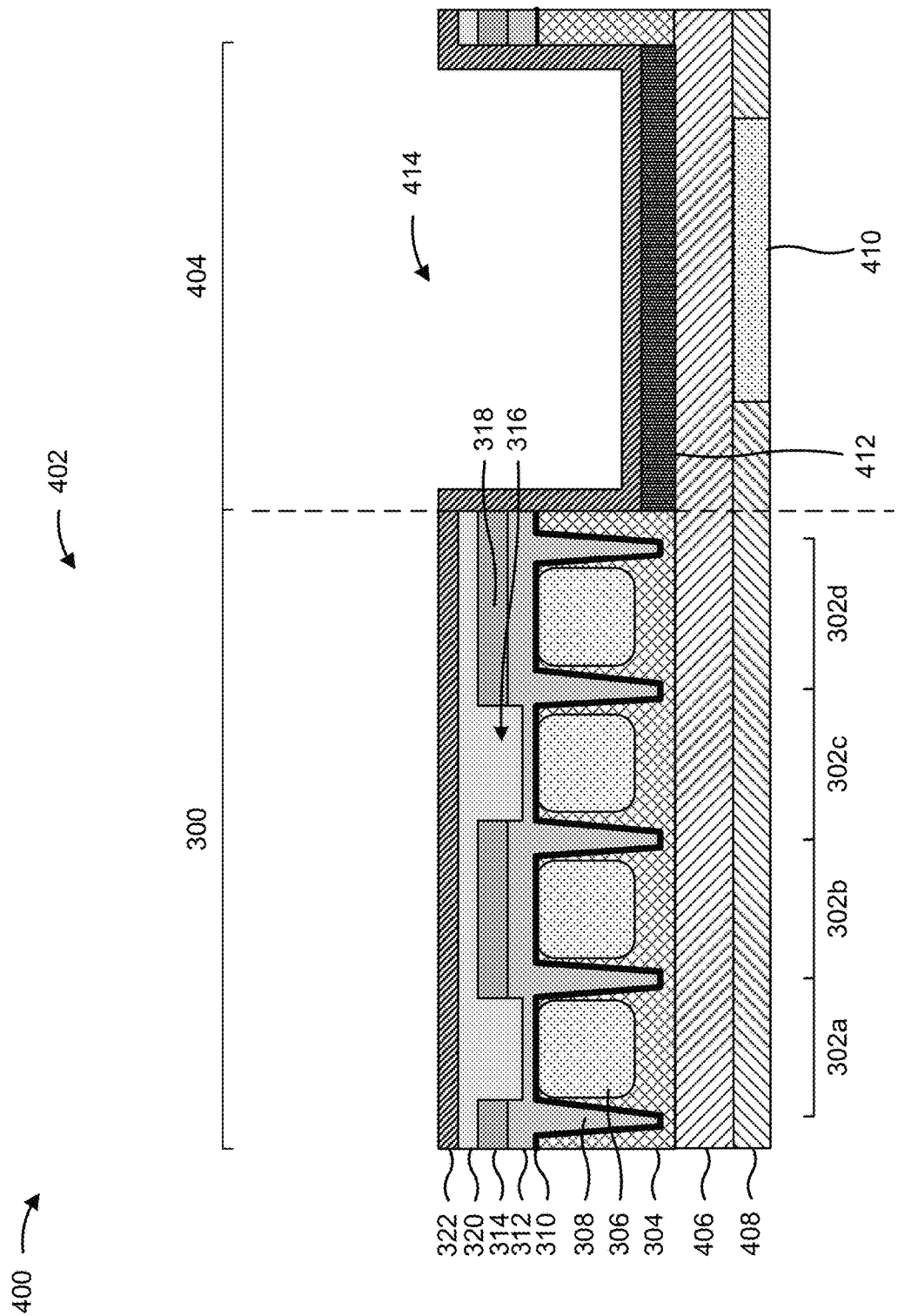
Figure 4L:
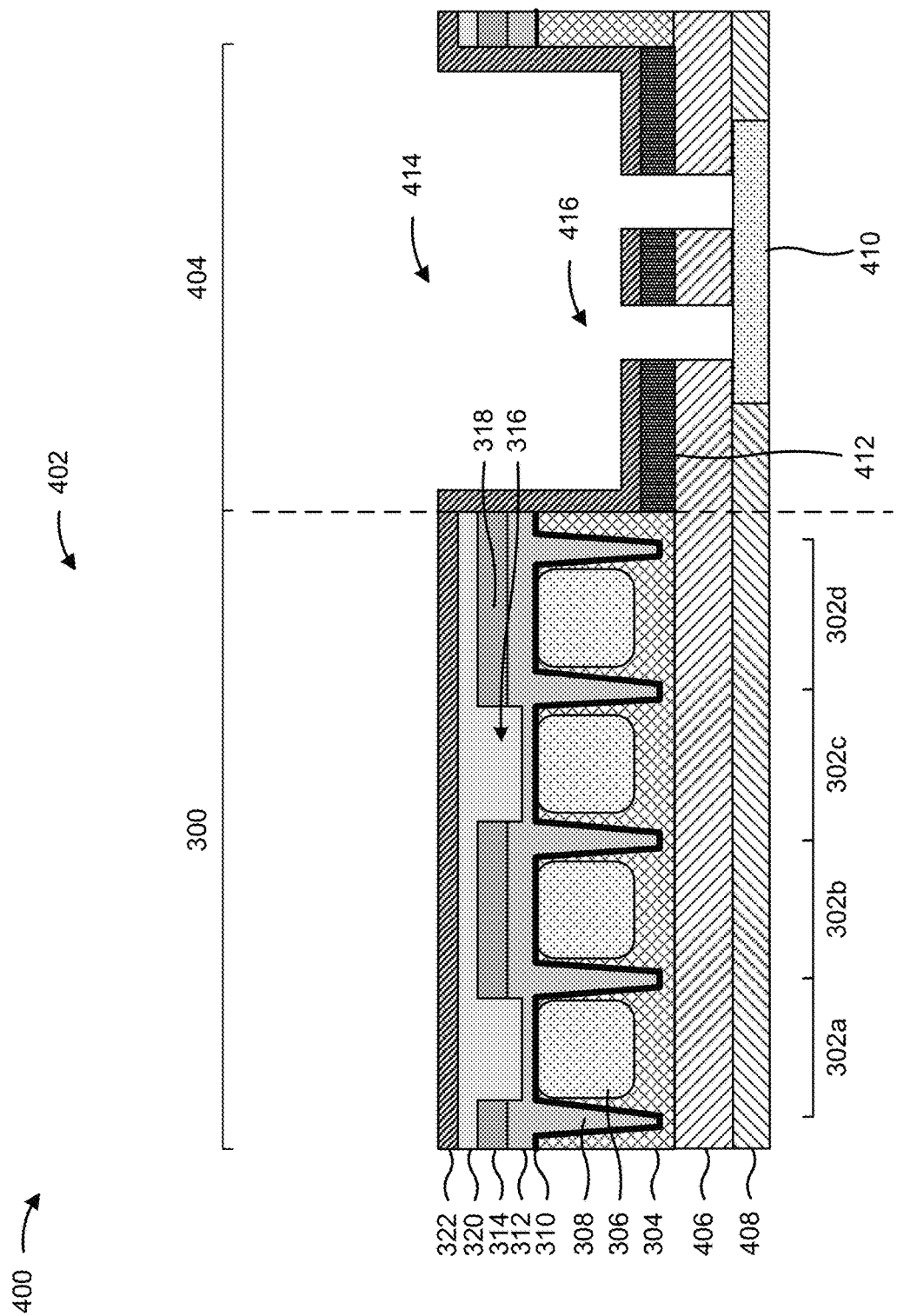
Figure 4M:
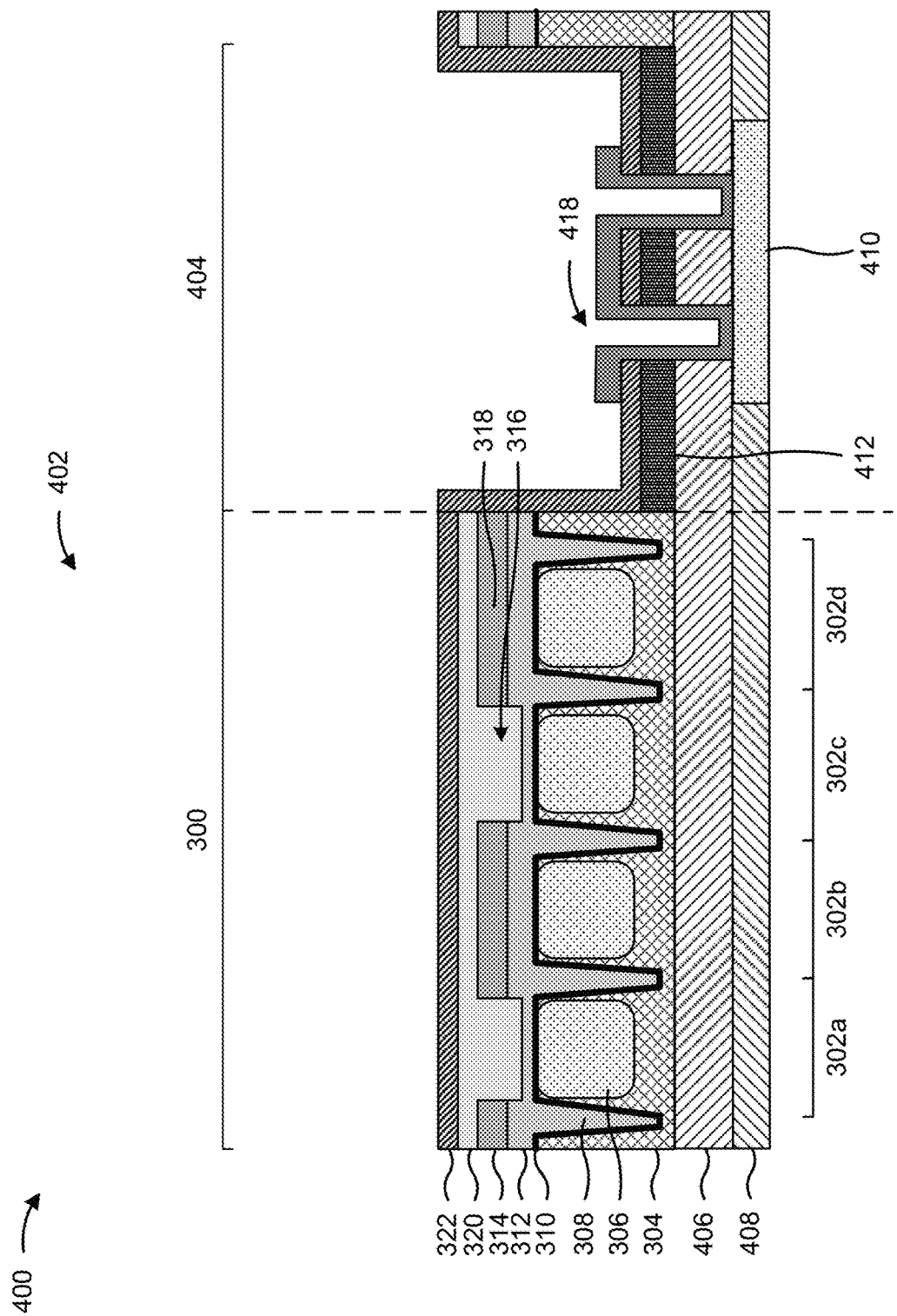
Figure 4N:
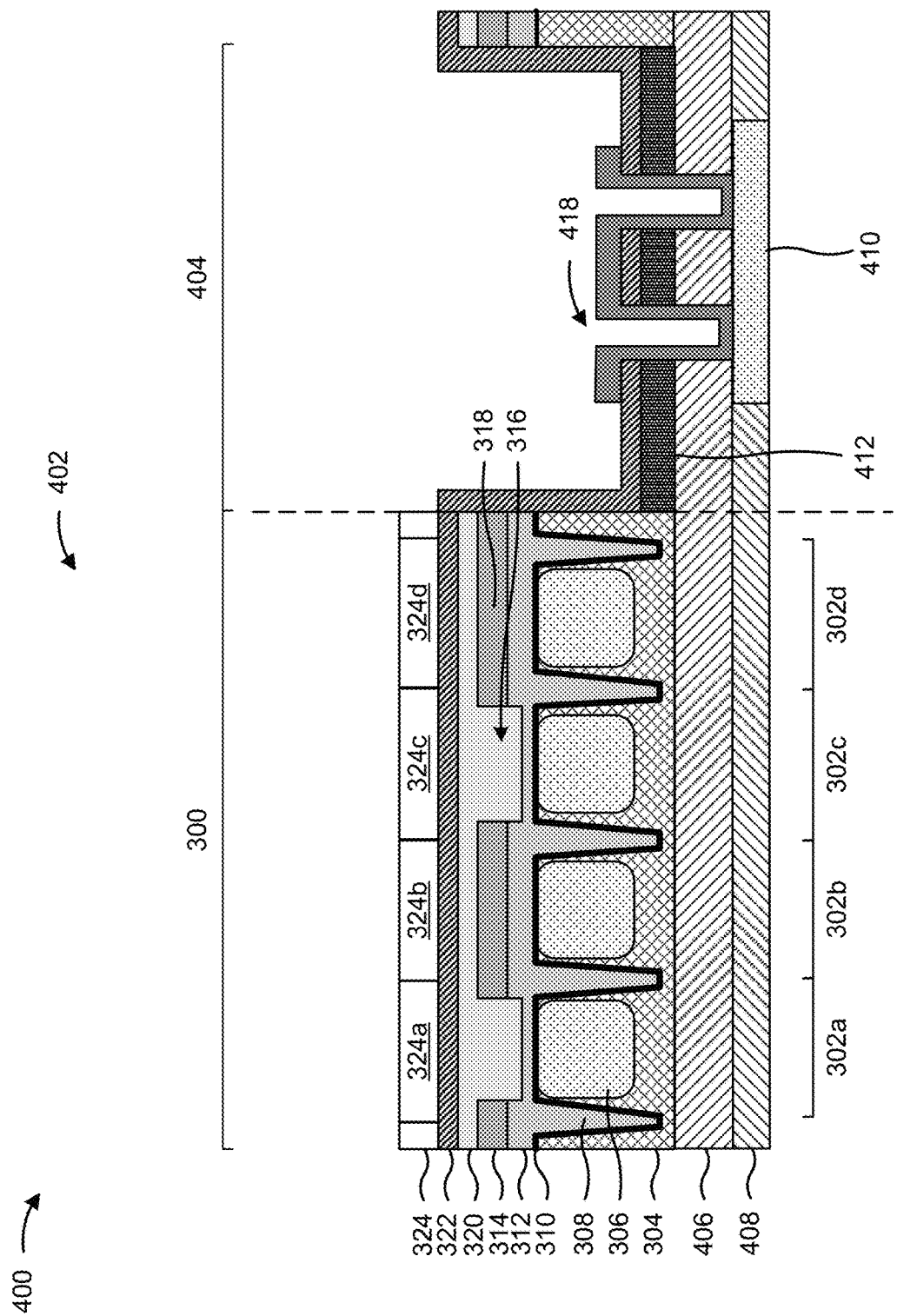
Figure 4O:
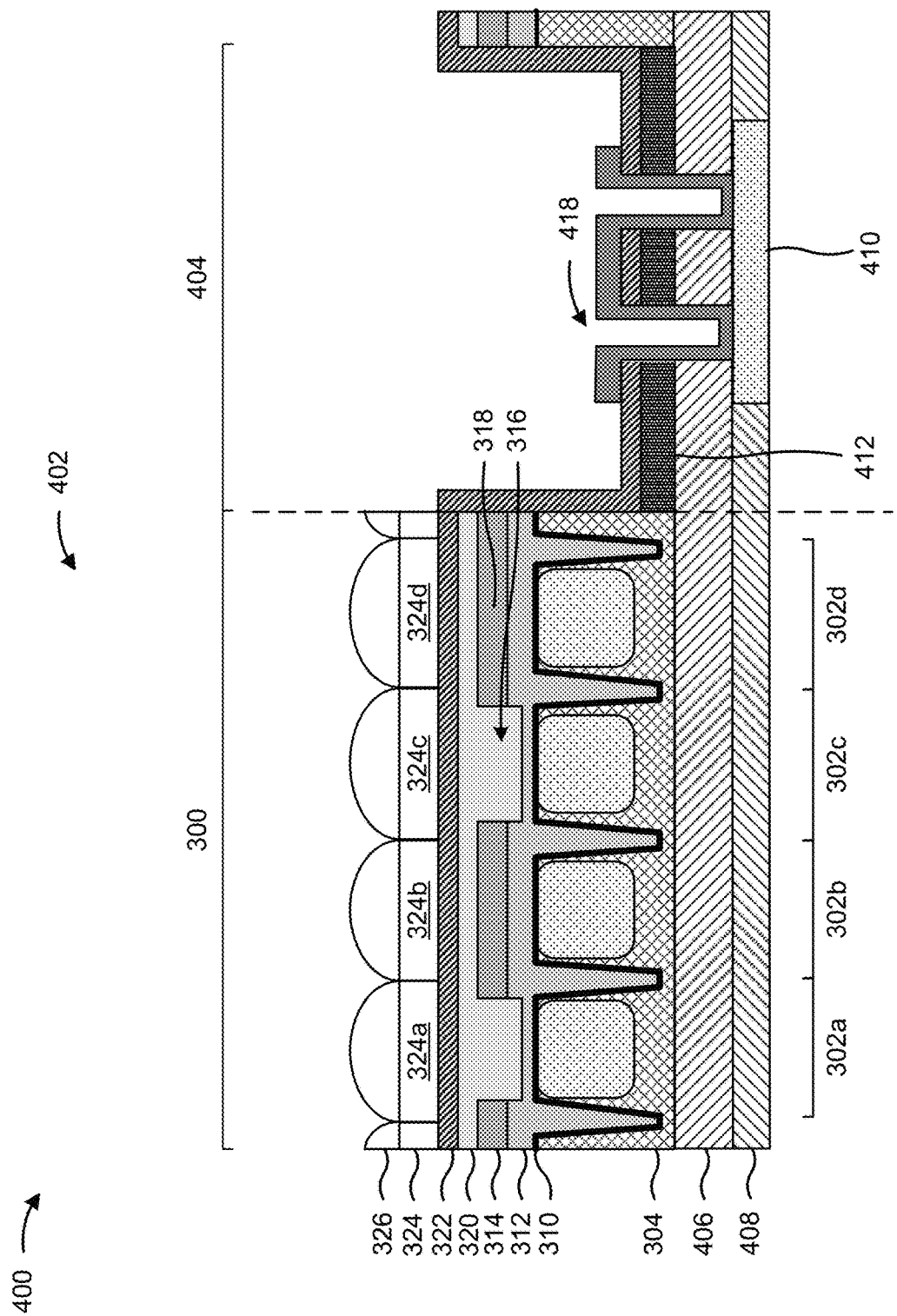

FIGS. 4A-4O are diagrams of an example implementation 400 described herein. Example implementation 400 may be an example process for forming an image sensor 402 including the pixel array 300, in which the pixel array 300 includes a plurality of visible light pixel sensors and a plurality of dark pixel sensors configured to generate dark current calibration information for calibrating the visible light information generated by the plurality of visible light pixel sensors. The image sensor 402 may include a CMOS image sensor, a BSI CMOS image sensor, or another type of image sensor.

As shown in FIG. 4A, the image sensor 402 may include a plurality of regions, such as the pixel array 300 and a bonding pad region 404 (which may also be referred to as an E-pad region), among other examples. Moreover, the image sensor 402 may include a plurality of layers, including the substrate 304, an interlayer dielectric (ILD) layer 406 on the substrate 304, and an inter-metal dielectric (IMD) layer 408 on the ILD layer 406, among other examples.

The pixel array 300 may include the pixel sensors 302 of the image sensor 402, such as the pixel sensors 302a-302d. The bonding pad region 404 may include one or more conductive bonding pads 410 (or E-pads) in the IMD layer 408, through which electrical connections between measurement circuitry of the image sensor 402, the pixel sensors 302, and/or outside devices may be established. Moreover, the bonding pad region 404 may include a shallow trench isolation (STI) structure 412 to provide electrical isolation in the bonding pad region 404.

The ILD layer 406 may provide electrical and optical isolation between the IMD layer 408 and the substrate 304. The IMD layer 408 may include the bonding pads 410 and other metal interconnecting structures that connect the image sensor 402 to a package, to external electrical connections, and/or to other external devices.

As shown in FIG. 4B, one or more semiconductor processing tools may form a plurality of photodiodes 306 in the substrate 304. For example, the ion implantation tool 114 may dope the portions of the substrate 304 using an ion implantation technique to form a respective photodiode 306 for each of the pixel sensors 302, such as the pixel sensor 302a, the pixel sensor 302b, the pixel sensor 302c, and the pixel sensor 302d. The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

As shown in FIG. 4C, the isolation structure 308 may be formed in the substrate 304. In particular, the isolation structure 308 may be formed between each of the photodiodes 306 of the pixel sensors 302. In some implementations, one or more semiconductor processing tools may be used to form the isolation structure 308 in the substrate 304. For example, the deposition tool 102 may form a photoresist layer on the top surface of the substrate 304, the exposure tool 104 may expose the photoresist layer to a radiation source to pattern the photoresist layer, the developer tool 106 may develop and remove portions of the photoresist layer to expose the pattern, and the etch tool 108 may etch the portions of substrate 304 to form the isolation structure 308 in the substrate 304. The etch tool 108 may etch the isolation structure 308 from the top surface of the substrate 304 and into the substrate 304 to form the isolation structure 308. In some implementations, a photoresist removal tool removes the remaining portions of the photoresist layer (e.g., using a chemical stripper and/or another technique) after the etch tool 108 etches the substrate 304.

As shown in FIG. 4D, the ARC 310 may be formed over and/or on the top surface of the substrate 304. Moreover, the ARC 310 may be formed in the isolation structure 308 (e.g., on the sidewalls and on the bottom surface of the isolation structure 308). In particular, a semiconductor processing tool (e.g., the deposition tool 102) may conformally deposit the ARC 310 using various PVD techniques, CVD techniques, and/or ALD techniques, such as sputtering, PECVD, HDP-CVD, SACVD, or PEALD. In some implementations, the semiconductor processing tool may form the ARC 310 to a thickness in a range from approximately 200 angstroms to approximately 1000 angstroms.

As shown in FIG. 4E, the isolation structure 308 may be filled with an oxide material such that the oxide layer 312 is formed in the isolation structure 308. Moreover, the oxide layer 312 may be formed over and/or on the ARC 310. In particular, a semiconductor processing tool (e.g., the deposition tool 102) may deposit the oxide material such that the oxide layer 312 is formed in the isolation structure 308 and over and/or the ARC 310. The semiconductor processing tool may deposit the oxide material using various PVD techniques, CVD techniques, and/or ALD techniques, such as sputtering, PECVD, HDP-CVD, SACVD, or PEALD. In some implementations, the planarization tool 110 planarizes the oxide layer 312 after the oxide layer 312 is deposited.

As shown in FIG. 4F, the metal layer 314 may be formed over and/or on the oxide layer 312. In some implementations, a semiconductor processing tool (e.g., the plating tool 112) may form the metal layer 314 using a plating technique such as electroplating (or electro-chemical deposition) or electro-less plating. In some implementations, another semiconductor processing tool (e.g., the deposition tool 102) deposits a seed layer of the material of the metal layer 314 over and/or on the oxide layer 312 to promote adhesion between the metal layer 314 and the oxide layer 312. The remaining material of the metal layer 314 may be deposited onto the seed layer by a plating technique.

As shown in FIG. 4G, the openings 316 may be formed through the metal layer 314 and into a portion of the oxide layer 312 for the visible light pixel sensors (e.g., the pixel sensors 302a and 302c). The opening 316 may be formed by coating the metal layer 314 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 316 into the metal layer 314 and into the portion of the oxide layer 312 (e.g., using the etch tool 108) based on the pattern in the photoresist. The un-etched or unremoved portions of the metal layer 314 may remain over the photodiodes 306 in the dark pixel sensors (e.g., the pixel sensors 302b and 302d) as the light blocking elements 318.

As shown in FIG. 4H, the BSI oxide layer 320 may be formed in the openings 316, over and/or on the metal layer 314, and over and/or on the light blocking elements 318. In particular, a semiconductor processing tool (e.g., the deposition tool 102) may deposit the BSI oxide layer 320 using various PVD techniques, CVD techniques, and/or ALD techniques, such as sputtering, PECVD, HDP-CVD, SACVD, or PEALD.

As shown in FIG. 4I, the BSI oxide layer 320 may be planarized. In particular, a semiconductor processing tool (e.g., the planarization tool 110) may perform a planarization or polishing process such as CMP. A CMP process may include depositing a slurry (or polishing compound) onto a polishing pad. A carrier substrate including the image sensor 402 may be mounted to a carrier, which may rotate the carrier substrate as the carrier substrate is pressed against the polishing pad. The slurry and polishing pad act as an abrasive that polishes or planarizes the BSI oxide layer 320 as the carrier substrate is rotated. The polishing pad may also be rotated to ensure a continuous supply of slurry is applied to the polishing pad.

As shown in FIG. 4J, an opening 414 (or trench) may be formed in the bonding pad region 404. In particular, the opening 414 may be formed through the BSI oxide layer 320, through the metal layer 314, through the oxide layer 312, through the ARC 310, and through the substrate 304 to the STI structure 412. The opening 414 may be formed by coating the BSI oxide layer 320 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 414 (e.g., using the etch tool 108) based on the pattern in the photoresist.

As shown in FIG. 4K, the buffer oxide layer 322 may be formed over the BSI oxide layer 320 and over the STI structure 412 in the opening 414. In particular, a semiconductor processing tool (e.g., the deposition tool 102) may deposit the buffer oxide layer 322 using various PVD techniques, CVD techniques, and/or ALD techniques, such as sputtering, PECVD, HDP-CVD, SACVD, or PEALD.

As shown in FIG. 4L, openings 416 (or vias) may be formed in the opening 414 of the bonding pad region 404. In particular, the openings 416 may be formed through the buffer oxide layer 322, through the STI structure 412, through the ILD layer 406, and to the bonding pad 410 in the IMD layer 408. The openings 416 may be formed by coating the buffer oxide layer 322 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 416 (e.g., using the etch tool 108) based on the pattern in the photoresist.

As shown in FIG. 4M, a bonding pad 418 may be formed in the openings 414. For example, a semiconductor processing tool (e.g., the deposition tool 102 or the plating tool 112) may form a metal layer (e.g., a copper layer, a cobalt layer, a tungsten layer, a ruthenium layer, a metal alloy layer, or another type of metal layer) on the buffer oxide layer 322, on the STI structure 412, and in the openings 416. Portions of the metal layer may be removed by coating the metal layer with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the portions (e.g., using the etch tool 108) based on the pattern in the photoresist to form the bonding pad 418.

As shown in FIG. 4N, the filter layer 324 may be formed for the pixel sensors 302 in the pixel array 300. The filter layer 324 may be formed by forming respective filer regions 324a-324d for the pixel sensors 302a-302d over and/or on the buffer oxide layer 322. In some implementations, a semiconductor processing tool (e.g., the deposition tool 102) may deposit the filter layer 324 using various PVD techniques, CVD techniques, and/or ALD techniques, such as sputtering, PECVD, HDP-CVD, SACVD, or PEALD. As shown in FIG. 4O, a micro-lens layer 326 including a plurality of micro-lenses is formed over and/or on the filter layer 324. The micro-lens layer 326 may include a respective micro-lens for each of the pixel sensors 302 included in the pixel array 300.

As indicated above, FIGS. 4A-4O are provided as an example. Other examples may differ from what is described with regard to FIGS. 4A-4O.

FIGS. 5A-5C are diagrams of example pixel sensor configurations described herein. The example pixel sensor configurations may include example pixel sensor configurations of visible light pixel sensors and dark pixel sensors for the pixel array 200 and/or 300 described herein. In each of the example pixel sensor configurations, each visible light pixel sensor is no more than one (1) pixel sensor away from a dark pixel sensor. In other words, each visible light pixel sensor in the example pixel sensor configurations borders at least one dark pixel sensor. In some cases, this may include a one-to-one association of visible light pixel sensors to dark pixel sensors or a one-to-many association of visible light pixel sensors to dark pixel sensors. Accordingly, the example pixel sensor configurations described in connection with FIGS. 5A-5C may provide highly accurate dark current measurements for the visible light pixel sensors, which may increase the accuracy of the dark current calibration of the visible light pixel sensors to achieve very low post-calibration dark current for the visible light pixel sensors.

As shown in FIG. 5A, an example pixel sensor configuration 500 may include a plurality of adjacent columns of visible light pixel sensors and dark pixel sensors. For example, the example pixel sensor configuration 500 may include a first column 502a of visible light pixel sensors, a first column 504a of dark pixel sensors adjacent to the first column 502a of visible light pixel sensors, a second column 502b of visible light pixel sensors adjacent to the first column 504a of dark pixel sensors, a second column 504b of dark pixel sensors adjacent to the second column 502b of visible light pixel sensors, a third column 502c of visible light pixel sensors adjacent to the second column 504b of dark pixel sensors, a third column 504c of dark pixel sensors adjacent to the third column 502c of visible light pixel sensors, and so on.

Each dark pixel sensor in a column of dark pixel sensors may generate dark current calibration information for a single (different) visible light pixel sensor in an adjacent column of visible light pixel sensors. For example, a first dark pixel sensor in the first column 504a may generate dark current calibration information for a single first visible light pixel sensor in the first column 502a, a second dark pixel sensor in the first column 504a may generate dark current calibration information for a single second visible light pixel sensor in the first column 502a (e.g., different from the single first visible light pixel sensor), and so on. A first dark pixel sensor in the second column 504b may generate dark current calibration information for a single first visible light pixel sensor in the second column 502b, a second dark pixel sensor in the second column 504b may generate dark current calibration information for a single second visible light pixel sensor in the second column 502*b* (e.g., different from the single first visible light pixel sensor), and so on. A first dark pixel sensor in the third column 504*c* may generate dark current calibration information for a single first visible light pixel sensor in the third column 502*c*, a second dark pixel sensor in the third column 504*c* may generate dark current calibration information for a single second visible light pixel sensor in the third column 502*c* (e.g., different from the single first visible light pixel sensor), and so on.

As shown in FIG. 5B, an example pixel sensor configuration 510 may include a plurality of interspersed visible light pixel sensors 512 and dark pixel sensors 514. In particular, the visible light pixel sensors 512 and the dark pixel sensors 514 may alternate throughout the example pixel sensor configuration 510 in a checkered pattern. Each of the dark pixel sensors 514 may generate dark current calibration information for an adjacent/bordering visible light pixel sensor 512.

As shown in FIG. 5C, an example pixel sensor configuration 520 may include a plurality of non-contiguous groups 522*a*-522*d* of visible light pixel sensors that are surrounded by a border 524 of a plurality of dark pixel sensors. Unlike a BLC area surrounding a pixel array, which may generate a dark current measurement for the entire pixel array, each of the dark pixel sensors in the border 524 of dark pixel sensors may generate dark current calibration information for a single visible light pixel sensor in one of the groups 522*a*-522*d*. This may increase the accuracy of the dark current calibration information and may increase the dark current performance of the visible light pixel sensors included in the example pixel sensor configuration 520. In some implementations, a plurality of dark pixel sensors in the border 524 may generate dark current calibration information for the same visible light pixel sensor, which may further increase the accuracy of the dark current calibration information and the dark current performance of the visible light pixel sensor.

As indicated above, FIGS. 5A-5C are provided as examples. Other examples may differ from what is described with regard to FIGS. 5A-5C.

Figures 6A, 6B, 6C:
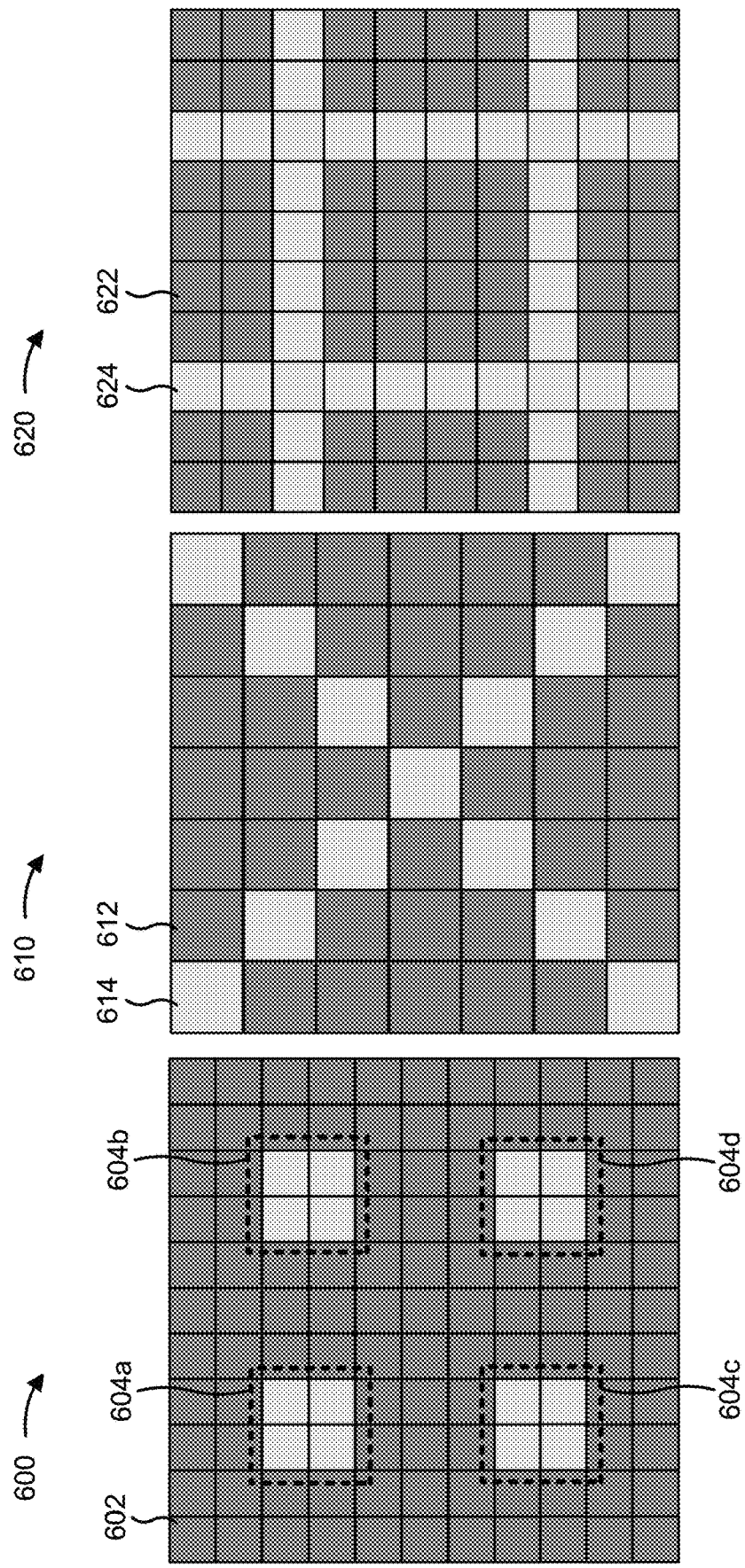

FIGS. 6A-6C are diagrams of example pixel sensor configurations described herein. The example pixel sensor configurations may include example pixel sensor configurations of visible light pixel sensors and dark pixel sensors for the pixel array 200 and/or 300 described herein. In each of the example pixel sensor configurations, one or more of the visible light pixel sensors is greater than one (1) pixel sensor away from a dark pixel sensor such that one or more dark pixel sensors are configured to generate dark current calibration information for a respective subset of visible light pixel sensors. In this way, fewer dark pixel sensors are included such that a greater quantity of visible light pixel sensors may be included. This may increase the color sensitivity and color saturation in the example pixel sensor configurations while still providing increased dark current performance. In some implementations, each visible light pixel sensor in the example pixel sensor configurations is within a range of two (2) pixel sensors away from a dark pixel sensor (e.g., to permit a greater quantity of visible light pixel sensors to be included) to approximately 100 pixel sensors away from a dark pixel sensor (e.g., to provide sufficient dark current calibration accuracy and sufficient dark current performance).

As shown in FIG. 6A, an example pixel sensor configuration 600 may include a plurality of visible light pixel sensors 602 and plurality of non-contiguous groups 604*a*-604*d* of dark pi*el-s-pixel sensors dispersed throughout the visible light pixel sensors 602. In some implementations, the example pixel sensor configuration 600 may include at least four (4) groups of dark pixels pixel sensors to provide sufficient dark current calibration accuracy and sufficient dark current performance for the visible light pixel sensors 602.

As shown in FIG. 6B, an example pixel sensor configuration 610 may include a plurality of visible light pixel sensors 612 and a plurality of dark pixel sensors 614 formed in diagonal lines through the example pixel sensor configuration 610. In some implementations, each segment of the diagonal lines of the dark pixel sensors 614 may be configured to generate dark current calibration information for one or more quadrants (or portions of one or more quadrants) of the visible light pixel sensors 612 in the example pixel sensor configuration 610.

As shown in FIG. 6C, an example pixel sensor configuration 620 may include a plurality of visible light pixel sensors 622 and plurality of dark pixel sensors 624 formed in a plurality of intersecting lines through the example pixel sensor configuration 620. In some implementations, each segment of the intersecting lines of the dark pixel sensors 624 may be configured to generate dark current calibration information for one or more groups (or portions of one or more groups) of the visible light pixel sensors 622 in the example pixel sensor configuration 620.

As indicated above, FIGS. 6A-6C are provided as examples. Other examples may differ from what is described with regard to FIGS. 6A-6C.

FIGS. 7A-7D are diagrams of an example implementation 700 described herein. The example implementation 700 may include an example of calibrating visible light information generated by a plurality of visible light pixel sensors included in the pixel array 300 based on dark current calibration information generated by a plurality of dark pixel sensors included in the pixel array 300.

Figure 7A:
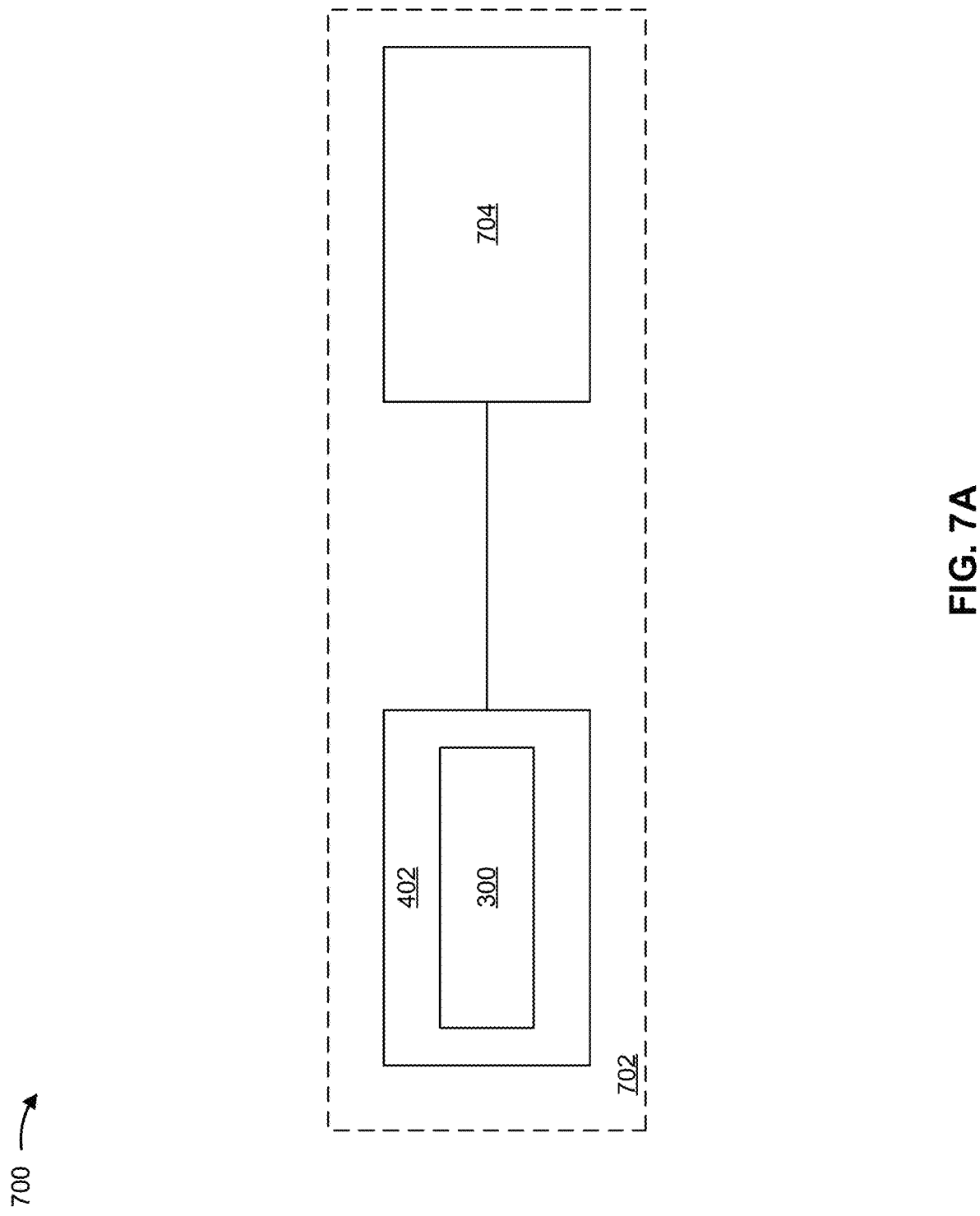

As shown in FIG. 7A, the pixel array 300 may be included in the image sensor 402, which may be included in a device 702. The device 702 may further include image processor 704, communicatively coupled with the image sensor 402, configured to process visible light information generated by the pixel array 300 to generate images and/or video. Moreover, the image processor 704 may be configured to process dark current calibration information generated by the pixel array 300 to calibrate the visible light information to increase the dark current performance of the pixel array 300. The device 702 may include a semiconductor die, a system on chip (SoC), a semiconductor package, a camera, a smartphone, or another type of device. In some implementations, the image processor 704 is integrated into the image sensor 402 or vice-versa. In some implementations, the image sensor 402 and the image processor 704 are included in separate devices. For example, the image processor 704 may be included in a computer or another device remote from the image sensor 402.

As shown in FIG. 7B, the plurality of visible light pixel sensors of the pixel array 300 may be configured to generate (and may generate) visible light information 706. The visible light information 706 may include respective photocurrents for each of the plurality of visible light pixel sensors. The magnitude of the respective photocurrents may represent or correspond to the intensity of various colors or wavelengths of incident light captured by the plurality of visible light pixel sensors. Thus, the visible light information 706 may include light intensity information across a broad range of color components of the incident light.

As further shown in FIG. 7B, various levels of dark current (in electrons per second (e-/sec)) may be present in (or may affect) the photocurrent levels included in the visible light information 706 for each of the plurality of visible light pixel sensors. In particular, dark current may artificially increase the magnitude of a photocurrent of a visible light pixel sensor, which may result in an elevated brightness level in the pixel associated with the visible light pixel sensor (e.g., in an image or a video). This may negatively affect the black level of the visible light pixel sensor.

As further shown in FIG. 7B, the dark pixel sensors may be configured to generate (and may generate) dark current calibration information 708 for the plurality of visible light pixel sensors. In some implementations, each dark pixel sensor is configured to generate (and generates) dark current calibration information for a single visible light pixel sensor. The dark current calibration information, associated with a visible light pixel sensor, may include a dark current measurement (e.g., in electrons per second (e-/sec)) for the visible light pixel sensor. The dark current measurement for a visible light pixel sensor may represent an estimation of the level of dark current in the visible light information generated by the visible light pixel sensor. Accordingly, the dark pixel sensors may be configured to generate (and may generate) the dark current calibration information approximately simultaneously with the visible light pixel sensors generating the visible light information, 1 or 2 milliseconds prior to visible light pixel sensors generating the visible light information, and/or 1 or 2 milliseconds after the visible light pixel sensors generate the visible light information.

As shown in FIG. 7C, the image sensor 402 may be configured to provide (and may provide) the visible light information 706 and the dark current calibration information 708 to the image processor 704. In some implementations, the image sensor 402 may be configured to provide (and may provide) the visible light information 706 and the dark current calibration information 708 to the image processor 704 on one or more metallization layers of a die or an SoC. In some implementations, the image sensor 402 may be configured to provide (and may provide) the visible light information 706 and the dark current calibration information 708 to the image processor 704 over one or more circuit traces of an integrated circuit or a printed circuit board (PCB). In some implementations, the image sensor 402 may be configured to provide (and may provide) the visible light information 706 and the dark current calibration information 708 to the image processor 704 over a communication cable such as an Ethernet cable or a universal serial bus (USB) cable. In some implementations, the image sensor 402 may be configured to provide (and may provide) the visible light information 706 and the dark current calibration information 708 to the image processor 704 over a public network and/or a private network, such as a wireless network, a wired network, a telecommunications network, a peer-to-peer network, a local area network (LAN), and/or the Internet.

In some implementations, the image sensor 402 may be configured to automatically provide (and may automatically provide) the visible light information 706 and the dark current calibration information 708 to the image processor 704 based on the visible light information 706 and the dark current calibration information 708 being generated. In some implementations, the image sensor 402 may be configured to provide (and may provide) the visible light information 706 and the dark current calibration information 708 to the image processor 704 based on a request from the image processor 704.

Figure 7D:
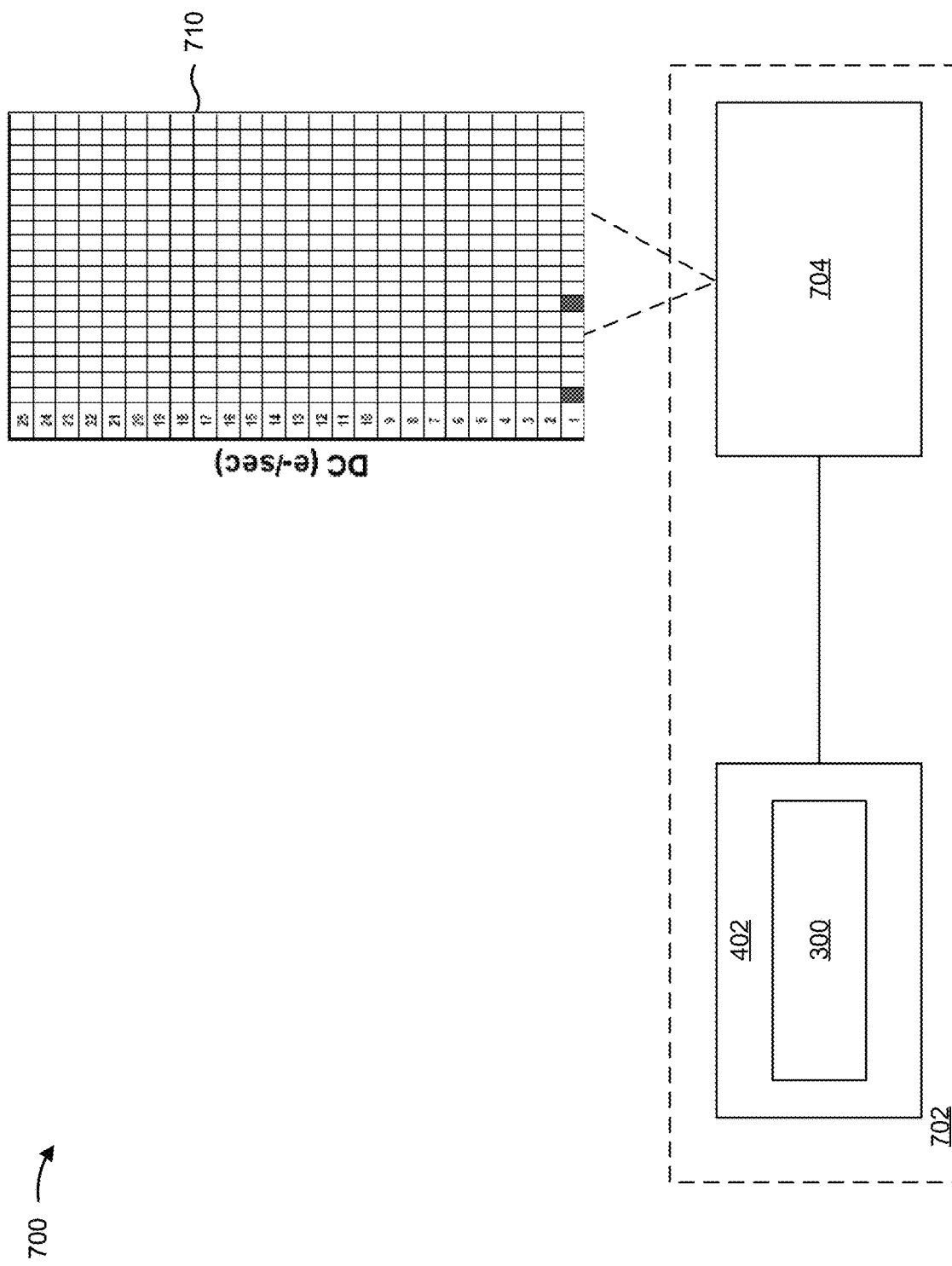

As shown in FIG. 7D, the image processor 704 may be configured to generate (and may generate) calibrated visible light information 710 from the visible light information 706 based on the dark current calibration information 708, which may be referred to as dark current calibration. To generate the calibrated visible light information 710 for a visible light pixel sensor, the image processor 704 may be configured to remove, subtract, and/or adjust the photocurrent generated by the visible light pixel sensor (e.g., included in the visible light information 706 associated with the visible light pixel sensor) based on the dark current measurement associated with the visible light pixel sensor (e.g., included in the dark current calibration information 708 associated with the visible light pixel sensor). The image processor 704 may be configured to remove, subtract, and/or adjust the photocurrent generated by each visible light pixel sensor based on the respective dark current measurements associated with each of the visible light pixel sensors such that each of the visible light pixel sensors is individually calibrated. As shown in FIG. 7D, the resulting dark current (e.g., in electrons per second (e-/sec)) for each of the visible light pixel sensors after dark current calibration is approximately zero or much lower than prior to dark current calibration. The individualized calibration of each of the visible light pixel sensors may be capable of addressing relatively large differences in dark current in the visible light information 706 that might not otherwise be correctable by an average dark current measurement of a BLC area.

In some implementations, the image processor 704 is configured to generate (and generates) the calibrated visible light information 710 in real-time or near-real-time with the generation of the visible light information 706. In these cases, the image processor 704 may generate a dark-current-calibrated stream of images and/or a video based on the generated dark current calibration information 708. In some implementations, the image processor 704 is configured to generate (and generates) the calibrated visible light information 710 after a longer time duration relative to the generation of the visible light information 706. In these examples, the image processor 704 may be configured to store (and may store) visible light information 706 and the dark current calibration information 708 in a data store such as a cache, a volatile or non-volatile memory, a storage device, a file system, and/or another type of data structure. The data store may be included in the image processor 704, may be included in the device 702, or may be remote from the device 702 such as a cloud storage, a data center, a network attached storage (NAS), or a computing device. The image processor 704 may be configured to obtain (and may obtain) the visible light information 706 and the dark current calibration information 708 from the data store and may generate the calibrated visible light information 710 based on obtaining the visible light information 706 and the dark current calibration information 708.

In some implementations, the image processor 704 is configured to automatically generate (and automatically generates) the calibrated visible light information 710 based on receiving the visible light information 706 and the dark current calibration information 708. In some implementations, the image processor 704 is configured to generate (and generates) the calibrated visible light information 710 as a part of a process to convert raw visible light information 706 to an image file format (e.g., JPEG, tag image file format (TIFF), portable network graphics (PNG)) or a video file format (e.g., MPEG, audio video interleave (AVI)). In some implementations, the image processor 704 is configured to generate (and generates) the calibrated visible light information 710 based on input to the device 702.

As indicated above, FIGS. 7A-7D are provided as an example. Other examples may differ from what is described with regard to FIGS. 7A-7D.

FIG. 8 is a diagram of example components of a device 800, which may correspond to the image sensor 402, the device 702, and/or the image processor 704. In some implementations, the image sensor 402, the device 702, and/or the image processor 704 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 associated with forming a pixel array. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming a plurality of photodiodes in a substrate of an image sensor (block 910). For example, the one or more semiconductor processing tools 102-114 may form a plurality of photodiodes 306 in the substrate 304 of the image sensor 402, as described above.

As further shown in FIG. 9, process 900 may include forming a metal layer over the plurality of photodiodes in the substrate (block 920). For example, the one or more semiconductor processing tools 102-114 may form the metal layer 314 over the plurality of photodiodes 306 in the substrate 304, as described above.

As further shown in FIG. 9, process 900 may include removing portions of the metal layer to form openings over a first subset of the plurality of photodiodes, where the openings are included for a plurality of visible light pixel sensors of the image sensor, and where remaining portions of the metal layer include light blocking elements over a second subset of the plurality of photodiodes for a plurality of dark pixel sensors of the image sensor (block 930). For example, the one or more semiconductor processing tools 102-114 may remove portions of the metal layer to form the openings 316 over a first subset of the plurality of photodiodes 306, as described above. In some implementations, the openings 316 are included for a plurality of visible light pixel sensors (e.g., pixel sensors 202, 302a, 302c, 512, 602, 612, and/or 622) of the image sensor 402. In some implementations, remaining portions of the metal layer 314 include the light blocking elements 318 over a second subset of the plurality of photodiodes 306 for a plurality of dark pixel sensors (e.g., pixel sensors 202, 302b, 302d, 514, 614, and/or 624) of the image sensor 402.

As further shown in FIG. 9, process 900 may include filling the openings with an oxide layer (block 940). For example, the one or more semiconductor processing tools 102-114 may fill the openings 316 with the oxide layer 320, as described above.

Process 900 may include additional implementations, such as any single implementation or any combination of implementations described below and/or in connection with one or more other processes described elsewhere herein.

In a first implementation, a first subset of the plurality of visible light pixel sensors is included in a first column 502a of a pixel array (e.g., pixel array 200 and/or 300) of the image sensor, a first subset of the plurality of dark pixel sensors is included in a second column 504a of the pixel array adjacent to the first column, a second subset of the plurality of visible light pixel sensors is included in a third column 502b of the pixel array adjacent to the second column, and a second subset of the plurality of dark pixel sensors is included in a fourth column 504b of the pixel array adjacent to the third column. In a second implementation, alone or in combination with the first implementation, the plurality of visible light pixel sensors and the plurality of dark pixel sensors are interspersed in a pixel array (e.g., pixel array 200 and/or 300) of the image sensor.

In a third implementation, alone or in combination with one or more of the first and second implementations, non-contiguous groups of the plurality of visible light pixel sensors (e.g., groups 522a, 522b, 522c, and/or 522c) are included in a pixel array (e.g., pixel array 200 and/or 300) of the image sensor, and the non-contiguous groups of the plurality of visible light pixel sensors are at least partially surrounded by the plurality of dark pixel sensors in the pixel array. In a fourth implementation, alone or in combination with one or more of the first through third implementations, the metal layer includes a plurality of layers (e.g., layers 328, 330, and/or 332), where a respective thickness of each of the plurality of layers is equal to or less than approximately 5000 angstroms.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

FIG. 10 is a flowchart of an example process 1000 associated with generating calibrated visible light information. In some implementations, one or more process blocks of FIG. 10 may be performed by a device (e.g., the device 702). In some implementations, one or more process blocks of FIG. 10 may be performed by another device or a group of devices separate from or including the device, such as a pixel array (e.g., pixel array 200 and/or 300), an image sensor (e.g., the image sensor 402), and/or an image processor (e.g., the image processor 704), among other examples. Additionally, or alternatively, one or more process blocks of FIG. 10 may be performed by one or more components of device 800, such as processor 820, memory 830, storage component 840, input component 850, output component 860, and/or communication component 870.

As shown in FIG. 10, process 1000 may include generating visible light information based on incident light into a plurality of visible light pixel sensors (block 1010). For example, the device (e.g., using a plurality of visible light pixel sensors, such as the pixel sensors 202, 302a, 302c, 512, 602, 612, and/or 622)) may generate the visible light information 706 based on incident light into a plurality of visible light pixel sensors, as described above.

As further shown in FIG. 10, process 1000 may include generating dark current calibration information for the plurality of visible light pixel sensors (block 1020). For example, the device (e.g., using a plurality dark pixel sensors, such as pixel sensors E202, 302b, 302d, 514, 614, and/or 624) may generate dark current calibration information for the plurality of visible light pixel sensors, as described above.

As further shown in FIG. 10, process 1000 may include providing the visible light information and the dark current calibration information to an image processor (block 1030). For example, the device may (e.g., using the image sensor 402) may provide the visible light information 706 and the dark current calibration information 708 to the image processor 704, as described above.

As further shown in FIG. 10, process 1000 may include generating, based on the dark current calibration information, calibrated visible light information from the visible light information (block 1040). For example, the device (e.g., using the image processor 704) may generate, based on the dark current calibration information 708, calibrated visible light information 710 from the visible light information 706, as described above.

Process 1000 may include additional implementations, such as any single implementation or any combination of implementations described below and/or in connection with one or more other processes described elsewhere herein.

In a first implementation, generating the calibrated visible light information includes generating the calibrated visible light information in near-real-time as the visible light information is generated. In a second implementation, alone or in combination with the first implementation, generating the calibrated visible light information includes storing the visible light information and the dark current calibration information in a data store, obtaining the visible light information and the dark current calibration information from the data store after storing the visible light information and the dark current calibration information in the data store, and generating the calibrated visible light information after obtaining the visible light information and the dark current calibration information from the data store.

In a third implementation, alone or in combination with one or more of the first and second implementations, generating the calibrated visible light information includes generating respective calibrated visible light information for each of the plurality of visible light pixel sensors. In a fourth implementation, alone or in combination with one or more of the first through third implementations, generating the dark current calibration information includes generating a dark current measurement for a single visible light pixel sensor of the plurality of visible light pixel sensors, and generating the calibrated visible light information includes subtracting the dark current measurement from a visible light current measurement associated with the single visible light pixel sensor.

In a fifth implementation, alone or in combination with one or more of the first through fourth implementations, generating the dark current calibration information includes generating another dark current measurement for another single visible light pixel sensor of the plurality of visible light pixel sensors, the dark current measurement and the other dark current measurement being different dark current measurements, and generating the calibrated visible light information includes subtracting the other dark current measurement from another visible light current measurement associated with the other single visible light pixel sensor.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

In this way, a pixel array includes a plurality of dark pixel sensors configured to generate dark current calibration information for a plurality of visible light pixel sensors included in the pixel array. In particular, the plurality of dark pixel sensors may generate respective dark current measurements for each of the plurality of visible light pixel sensors (e.g., one-to-one or per-pixel-sensor dark current measurements) or for small subsets of the plurality of visible light pixel sensors. In this way, each of the plurality of visible light pixel sensors may be individually calibrated (or small subsets of the plurality of visible light pixel sensors may be individually calibrated) based on an estimated dark current experienced by each of the plurality of visible light pixel sensors. This individual dark current calibration may enable more accurate dark current calibration of the visible light pixel sensors included in the pixel array, and may be used to account for large differences in estimated dark currents for the visible light pixel sensors.

As described in greater detail above, some implementations described herein provide a pixel array. The pixel array includes a plurality of visible light pixel sensors configured to generate visible light information. The pixel array includes a plurality of dark pixel sensors configured to generate dark current calibration information. A subset of the dark current calibration information generated by a dark pixel sensor of the plurality of dark pixel sensors is to be used for calibrating a subset of the visible light information generated by one or more of the plurality of visible light pixel sensors.

As described in greater detail above, some implementations described herein provide a method. The method includes forming a plurality of photodiodes in a substrate of an image sensor. The method includes forming a metal layer over the plurality of photodiodes in the substrate. The method includes removing portions of the metal layer to form openings over a first subset of the plurality of photodiodes, where the openings are included for a plurality of visible light pixel sensors of the image sensor, and where remaining portions of the metal layer include light blocking elements over a second subset of the plurality of photodiodes for a plurality of dark pixel sensors of the image sensor. The method includes filling the openings with an oxide layer.

As described in greater detail above, some implementations described herein provide a device. The device includes a plurality of visible light pixel sensors configured to generate visible light information based on incident light into the plurality of visible light pixel sensors. The device includes a plurality of dark pixel sensors configured to generate dark current calibration information for the plurality of visible light pixel sensors. The device includes an image sensor configured to provide the visible light information and the dark current calibration information to an image processor. The device includes the image processor configured generate, based on the dark current calibration information, calibrated visible light information from the visible light information.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
a plurality of visible light pixel sensors configured to generate visible light information; and
a plurality of dark pixel sensors configured to generate dark current calibration information,
wherein each dark pixel sensor, of the plurality of dark pixel sensors, is configured to generate a subset of the dark current calibration information to be used for individually calibrating a single respective visible light pixel sensor of the plurality of visible light pixel sensors,
wherein the plurality of visible light pixel sensors comprise a two-dimensional array of non-contiguous groups of visible light pixel sensors, and
wherein each of the non-contiguous groups of visible light pixel sensors are surrounded by a border of dark pixel sensors of the plurality of dark pixel sensors.

2. The pixel array of claim 1, wherein each of the non-contiguous groups of visible light pixel sensors are two-dimensional arrays.

3. The pixel array of claim 1, wherein light blocking elements are included over photodiodes of the plurality of dark pixel sensors without being included over photodiodes of the plurality of visible light pixel sensors.

4. The pixel array of claim 3, wherein the light blocking elements comprise a layer including at least one of:
aluminum (Al),
copper (Cu),
silver (Ag), or
gold (Au).

5. The pixel array of claim 3, wherein the light blocking elements comprise:
a first layer including tungsten; and
a second layer, on the first layer, including at least one of:
aluminum (Al),
copper (Cu),
silver (Ag), or
gold (Au).

6. The pixel array of claim 5, wherein the light blocking elements further comprise:
a third layer, on the second layer, including at least one of:
aluminum (Al),
copper (Cu),
silver (Ag), or
gold (Au).

7. The pixel array of claim 3, wherein the light blocking elements comprise:
a first layer comprising a first material having a first refractive index;
a second layer comprising a second material having a second refractive index that is lower relative to the first refractive index;
a third layer comprising a third material having a third refractive index that is greater relative to the second refractive index; and
a fourth layer comprising a fourth material having a fourth refractive index that is lower relative to the third refractive index.

8. The pixel array of claim 7, wherein the first material, the second material, the third material, and the fourth material each include at least one of:
a compound comprising an oxide or a nitride,
a compound derivative comprising an oxide or a nitride,
a doped compound comprising an oxide or a nitride, or
an organic material.

9. The pixel array of claim 1, further comprising:
an isolation structure between adjacent pixel sensors of the pixel array.

10. A method, comprising:
forming a plurality of photodiodes in a substrate of an image sensor;
forming a metal layer over the plurality of photodiodes in the substrate;
removing portions of the metal layer to form openings over a first subset of the plurality of photodiodes,
wherein the openings are included for a plurality of visible light pixel sensors of the image sensor, wherein remaining portions of the metal layer include light blocking elements over a second subset of the plurality of photodiodes for a plurality of dark pixel sensors of the image sensor, wherein each dark pixel sensor, of the plurality of dark pixel sensors, is configured to generate dark current calibration information to be used for individually calibrating a single respective visible light pixel sensor of the plurality of visible light pixel sensors, wherein the plurality of visible light pixel sensors comprise a two-dimensional array of non-contiguous groups of visible light pixel sensors, and wherein each of the non-contiguous groups of visible light pixel sensors are surrounded by a border of dark pixel sensors of the plurality of dark pixel sensors; and filling the openings with an oxide layer.

11. The method of claim 10, wherein a first subset of the plurality of visible light pixel sensors is included in a first column of a pixel array of the image sensor;

wherein a first subset of the plurality of dark pixel sensors is included in a second column of the pixel array adjacent to the first column;

wherein a second subset of the plurality of visible light pixel sensors is included in a third column of the pixel array; and wherein a second subset of the plurality of dark pixel sensors is included in a fourth column of the pixel array adjacent to the third column.

12. The method of claim 10, wherein each of the non-contiguous groups of visible light pixel sensors are two-dimensional arrays.

13. The method of claim 10, wherein the metal layer comprises a plurality of layers; and wherein a respective thickness of each of the plurality of layers is equal to or less than 5000 angstroms.

14. The method of claim 10, further comprising:

forming a back side illuminated (B SI) oxide layer in the openings and on the light blocking elements.

15. A device, comprising:

a plurality of visible light pixel sensors configured to generate visible light information based on incident light into the plurality of visible light pixel sensors;

a plurality of dark pixel sensors configured to generate dark current calibration information for the plurality of visible light pixel sensors, wherein each dark pixel sensor, of the plurality of dark pixel sensors, is configured to generate a subset of the dark current calibration information to be used for individually calibrating a single respective visible light pixel sensor of the plurality of visible light pixel sensors, wherein the plurality of visible light pixel sensors comprise a two-dimensional array of non-contiguous groups of visible light pixel sensors, and wherein each of the non-contiguous groups of visible light pixel sensors are surrounded by a border of dark pixel sensors of the plurality of dark pixel sensors;

an image sensor configured to output the visible light information and the dark current calibration information; and an image processor configured to receive the visible light information and the dark current calibration information and generate, based on the dark current calibration information, calibrated visible light information from the visible light information.

16. The device of claim 15, wherein the image processor, when generating the calibrated visible light information, is configured to:

generate the calibrated visible light information in near-real-time as the visible light information is generated.

17. The device of claim 15, wherein the image processor, when generating the calibrated visible light information, is configured to:

store the visible light information and the dark current calibration information in a data store;

obtain the visible light information and the dark current calibration information from the data store after storing the visible light information and the dark current calibration information in the data store; and generate the calibrated visible light information after obtaining the visible light information and the dark current calibration information from the data store.

18. The device of claim 15, wherein the image processor, when generating the calibrated visible light information, is configured to:

generate respective calibrated visible light information for each of the plurality of visible light pixel sensors.

19. The device of claim 15, wherein each dark pixel sensor of the plurality of dark pixel sensors, when generating the subset of the dark current calibration information, is configured to:

generate a respective dark current measurement for the single respective visible light pixel sensor; and wherein the image processor, when generating the calibrated visible light information, is configured to:

subtract the respective dark current measurement from a visible light current measurement associated with the single respective visible light pixel sensor.

20. The device of claim 15, wherein the image sensor comprises:

a pixel array comprising the plurality of visible light pixel sensors and the plurality of dark pixel sensors; and a bonding pad region.

* * * * *